(12) United States Patent
Nakanishi et al.

(10) Patent No.: US 12,417,954 B2
(45) Date of Patent: Sep. 16, 2025

(54) SEMICONDUCTOR DEVICE

(71) Applicant: ROHM CO., LTD., Kyoto (JP)

(72) Inventors: Masaharu Nakanishi, Kyoto (JP); Noriaki Kawamoto, Kyoto (JP)

(73) Assignee: ROHM CO., LTD., Kyoto (JP)

(*) Notice: Subject to any disclaimer, the term of this patent is extended or adjusted under 35 U.S.C. 154(b) by 482 days.

(21) Appl. No.: 17/920,554

(22) PCT Filed: Apr. 27, 2021

(86) PCT No.: PCT/JP2021/016736
§ 371 (c)(1),
(2) Date: Oct. 21, 2022

(87) PCT Pub. No.: WO2021/221042
PCT Pub. Date: Nov. 4, 2021

(65) Prior Publication Data
US 2023/0154815 A1   May 18, 2023

(30) Foreign Application Priority Data

Apr. 27, 2020 (JP) ................................. 2020-078278

(51) Int. Cl.
*H01L 23/34* (2006.01)
*H01L 23/00* (2006.01)
(Continued)

(52) U.S. Cl.
CPC ........ *H01L 23/34* (2013.01); *H01L 23/49562* (2013.01); *H01L 24/32* (2013.01);
(Continued)

(58) Field of Classification Search
CPC ... H01L 23/34; H01L 23/49562; H01L 24/32; H01L 24/48
See application file for complete search history.

(56) References Cited

U.S. PATENT DOCUMENTS 5,049,961 A * 9/1991 Zommer .............. H01D 84/143
257/470
6,218,889 B1 * 4/2001 Fujiki ..................... H01L 23/34
327/512
(Continued)

FOREIGN PATENT DOCUMENTS

CN     103688352 B  *  6/2016  ............. H01L 23/36
CN     110337784 A  *  10/2019 ............. H02M 1/08
(Continued)

OTHER PUBLICATIONS

International Search Report issued in PCT/JP2021/016736, Jul. 27, 2021 (2 pages).
(Continued)

*Primary Examiner* — Laura M Menz
(74) *Attorney, Agent, or Firm* — HSML P.C.

(57) ABSTRACT

A semiconductor device includes: a switching element including a drain electrode, a gate electrode, and a source electrode; a base supporting the switching element; and a first terminal, a second terminal, a third terminal, and a fourth terminal that each extend in the same direction. The switching element includes a temperature detection diode having a first electrode provided on the element obverse surface. Each of the drain electrode, the gate electrode, and the source electrode is electrically connected to a corresponding one of the first terminal, the second terminal, and the third terminal. The first electrode is electrically connected to the fourth terminal via a first wire.

20 Claims, 15 Drawing Sheets

(51) Int. Cl.
   *H01L 23/495* (2006.01)
   *H10D 84/80* (2025.01)
(52) U.S. Cl.
   CPC .............. *H01L 24/48* (2013.01); *H01L 24/73* (2013.01); *H10D 84/811* (2025.01); *H01L 2224/32245* (2013.01); *H01L 2224/48245* (2013.01); *H01L 2224/73265* (2013.01); *H01L 2924/10272* (2013.01); *H01L 2924/12036* (2013.01); *H01L 2924/13091* (2013.01); *H01L 2924/182* (2013.01)

(56) References Cited

U.S. PATENT DOCUMENTS

| | | | | |
|---|---|---|---|---|
| 8,138,600 B2 * | 3/2012 | Muto | ................... | H01L 21/565 257/E25.012 |
| 9,952,273 B2 * | 4/2018 | Otremba | ........... | H01L 23/49548 |
| 11,081,433 B2 * | 8/2021 | Saito | ................. | H01L 23/49524 |
| 11,094,615 B2 * | 8/2021 | Michikoshi | ............. | H01L 23/48 |
| 11,948,866 B2 * | 4/2024 | Kawashima | ........ | H01L 23/5386 |
| 2006/0244496 A1 * | 11/2006 | Kawakita | ............. | F02P 3/0552 327/110 |
| 2011/0080192 A1 * | 4/2011 | Ogawa | ................ | H03K 17/063 327/109 |
| 2014/0070319 A1 * | 3/2014 | Tonomura | ............ | H01D 89/611 438/237 |
| 2014/0367739 A1 * | 12/2014 | Muto | ...................... | H01L 24/37 257/146 |
| 2016/0293549 A1 * | 10/2016 | Otremba | ........... | H01L 23/49548 |
| 2017/0179108 A1 * | 6/2017 | Okuda | ................... | H01D 30/63 |
| 2018/0197807 A1 * | 7/2018 | Haga | .................. | H01L 24/4842 |
| 2018/0261690 A1 * | 9/2018 | Muto | ..................... | H10D 12/038 |
| 2020/0111727 A1 * | 4/2020 | Tsuno | ..................... | H01L 24/06 |
| 2020/0194405 A1 * | 6/2020 | Koyanagi | ............. | H01L 25/072 |
| 2020/0411422 A1 * | 12/2020 | Xue | ................. | H01L 23/49541 |
| 2022/0102252 A1 * | 3/2022 | Osumi | ............... | H01L 23/3107 |
| 2022/0139813 A1 * | 5/2022 | Kawashima | .......... | H01L 25/072 257/555 |
| 2022/0321018 A1 * | 10/2022 | Nakakohara | .......... | H02M 1/327 |
| 2023/0080613 A1 * | 3/2023 | Sugiyama | ............. | H01L 25/072 257/192 |
| 2023/0154815 A1 * | 5/2023 | Nakanishi | ............ | H10D 84/811 257/213 |
| 2023/0245959 A1 * | 8/2023 | Hayashi | .............. | H01L 23/3107 257/676 |
| 2023/0245962 A1 * | 8/2023 | Saito | ................. | H01L 23/49562 257/676 |
| 2023/0421044 A1 * | 12/2023 | Sato | ................... | H02M 3/33523 |
| 2024/0379574 A1 * | 11/2024 | Osumi | .............. | H01L 23/49575 |
| 2024/0421022 A1 * | 12/2024 | Umegami | ........... | H01L 23/3107 |
| 2025/0046664 A1 * | 2/2025 | Tanikawa | ............ | H01L 23/48 |
| 2025/0149405 A1 * | 5/2025 | Fuji | ......................... | H01L 25/07 |

FOREIGN PATENT DOCUMENTS

| | | | | | |
|---|---|---|---|---|---|
| CN | 115428143 | A | * | 12/2022 | ............. H01L 23/34 |
| CN | 117318437 | A | * | 12/2023 | ............. H02M 1/08 |
| CN | 112511001 | B | * | 4/2024 | .......... H02M 1/0025 |
| CN | 118891717 | A | * | 11/2024 | ......... H01L 23/3107 |
| DE | 10 2009 009 874 | A1 | | 9/2009 | |
| DE | 10 2012 102 788 | A1 | | 10/2013 | |
| DE | 11 2013 007 361 | T5 | | 5/2016 | |
| DE | 11 2013 007 376 | T5 | | 5/2016 | |
| DE | 10 2015 104 990 | A1 | | 10/2016 | |
| DE | 11 2018 002 137 | T5 | | 1/2020 | |
| DE | 212021000149 | U1 | * | 5/2022 | ............. H01L 23/34 |
| DE | 112021001167 | T5 | * | 1/2023 | ............. H01L 23/34 |
| DE | 112023000851 | T5 | * | 11/2024 | ......... H01L 23/3107 |
| DE | 112023001614 | T5 | * | 1/2025 | ......... H01L 23/3107 |
| EP | 2728615 | A1 | * | 5/2014 | ............. H01L 23/36 |
| EP | 4517823 | A1 | * | 3/2025 | ......... H01L 23/3107 |
| JP | 2008021796 | A | * | 1/2008 | ........... H01L 21/565 |
| JP | 2013-4943 | A | | 1/2013 | |
| JP | 2013004943 | A | * | 1/2013 | ............. H01L 24/33 |
| JP | 2013012596 | A | * | 1/2013 | ............. H01L 23/36 |
| JP | 5232367 | B2 | * | 7/2013 | ........... H01L 21/565 |
| JP | 2013251500 | A | * | 12/2013 | ............. H01L 24/36 |
| JP | 5396436 | B2 | * | 1/2014 | ............. H01L 23/36 |
| JP | 2019-121745 | A | | 7/2019 | |
| JP | 2020098811 | A | * | 6/2020 | ......... H01L 23/3121 |
| JP | 2020188085 | A | * | 11/2020 | ......... H01L 23/3107 |
| JP | 6817777 | B2 | * | 1/2021 | ......... H01L 23/3171 |
| JP | 2022074290 | A | * | 5/2022 | ............. H01L 23/31 |
| JP | 2023123879 | A | * | 9/2023 | ......... H01L 23/3107 |
| JP | 7516626 | B2 | * | 7/2024 | ......... H01L 23/3107 |
| JP | 7550218 | B2 | * | 9/2024 | ............. H01L 23/34 |
| JP | 2024164272 | A | * | 11/2024 | ............. H01L 23/34 |
| WO | WO-2012111285 | A1 | * | 8/2012 | ....... H01L 21/823475 |
| WO | WO-2013002338 | A1 | * | 1/2013 | ............. H01L 23/36 |
| WO | WO-2018159018 | A1 | * | 9/2018 | ............. H01L 23/48 |
| WO | WO-2019102694 | A1 | * | 5/2019 | ............. H01L 23/28 |
| WO | WO-2021221042 | A1 | * | 11/2021 | ............. H01L 23/34 |
| WO | WO-2023100659 | A1 | * | 6/2023 | ......... H01L 23/3121 |
| WO | WO-2023167000 | A1 | * | 9/2023 | ......... H01L 23/3107 |
| WO | WO-2023189650 | A1 | * | 10/2023 | ......... H01L 23/4951 |
| WO | WO-2023214500 | A1 | * | 11/2023 | ......... H01L 23/3107 |
| WO | WO-2024018810 | A1 | * | 1/2024 | |
| WO | WO-2024181147 | A1 | * | 9/2024 | |
| WO | WO-2024203278 | A1 | * | 10/2024 | |

OTHER PUBLICATIONS

Office Action received in the corresponding German Patent application, Dec. 12, 2022, and machine translation (14 pages).
Office Action issued in corresponding Japanese Patent Application No. 2022-518074, Apr. 2, 2024, and machine translation (6 pages).
Notice of Summons to the Oral hearings issued in corresponding German Patent application No. 11 2021 001 167.7, May 26, 2025, and machine translation (8 pages).
Office Action issued in corresponding Japanese Patent application No. 2024-150980, Jun. 24, 2025, and machine translation (6 pages).
Office Action issued in corresponding German Patent application No. 11 2021 001 167.7, Jul. 25, 2025, and machine translation (6 pages).

* cited by examiner

SEMICONDUCTOR DEVICE

TECHNICAL FIELD

The present disclosure relates to a semiconductor device.

BACKGROUND ART

Patent document 1 discloses an example of a switching device (semiconductor device) equipped with a switching element such as a MOSFET. The switching element includes a drain electrode, a gate electrode, and a source electrode. The semiconductor device disclosed in the document includes three terminals (i.e., a gate terminal, a source terminal, and a drain terminal). The gate terminal is for inputting an electrical signal to the gate electrode. While the current to be converted based on the electrical signal is applied to the drain electrode via the drain terminal, a current converted based on the electrical signal will flow from the source electrode to the outside via the source terminal.

In a semiconductor device such as the one disclosed in the patent document 1, it is necessary to accurately know the temperature of a bonding portion (i.e., junction temperature) of a semiconductor element because the presence/absence of a failure, life, and reliability are closely related to the temperature during operation. When the semiconductor element is a MOSFET, the junction temperature can be measured by using a body diode in the switching element and a thermal resistance measuring device. For example, when the thermal resistance measuring device is used, the junction temperature can be estimated by first applying a driving voltage to the switching element, then supplying a current to the body diode, and measuring the voltage with the thermal resistance measuring device.

However, conducting the measurement of the junction temperature with the thermal resistance measuring device as described above is suitable in a laboratory, but not in a situation where the semiconductor device is actually used (i.e., when the switching element is driven).

PRIOR ART DOCUMENT

Patent Document

Patent Document 1: JP-A-2019-121745

SUMMARY OF THE INVENTION

Problem to be Solved by the Invention

The present disclosure has been conceived in view of the problem noted above, and aims to provide a semiconductor device capable of measuring the junction temperature when a switching element is driven.

A semiconductor device provided by the present disclosure includes: a switching element having an element obverse surface and an element reverse surface that face away from each other in a first direction, and including a drain electrode, a gate electrode, and a source electrode, where the switching element performs on/off control between the drain electrode and the source electrode by applying a driving voltage across the gate electrode and the source electrode with a potential difference being present between the drain electrode and the source electrode; a base having an obverse surface and a reverse surface that face away from each other in the first direction, and supporting the switching element with the element reverse surface facing the obverse surface; and a first terminal, a second terminal, a third terminal, and a fourth terminal that each extend in a second direction perpendicular to the first direction. The switching element includes a temperature detection diode having a first electrode provided on the element obverse surface. Each of the drain electrode, the gate electrode, and the source electrode is electrically connected to a different one of the first terminal, the second terminal, and the third terminal. The first electrode is electrically connected to the fourth terminal via a first wire.

Advantages of the Invention

According to the configuration as described above, the junction temperature can be measured when the switching element is driven.

Other features and advantages of the present disclosure will be more apparent from the detailed description given below with reference to the accompanying drawings.

MODE FOR CARRYING OUT THE INVENTION

Figure 1:
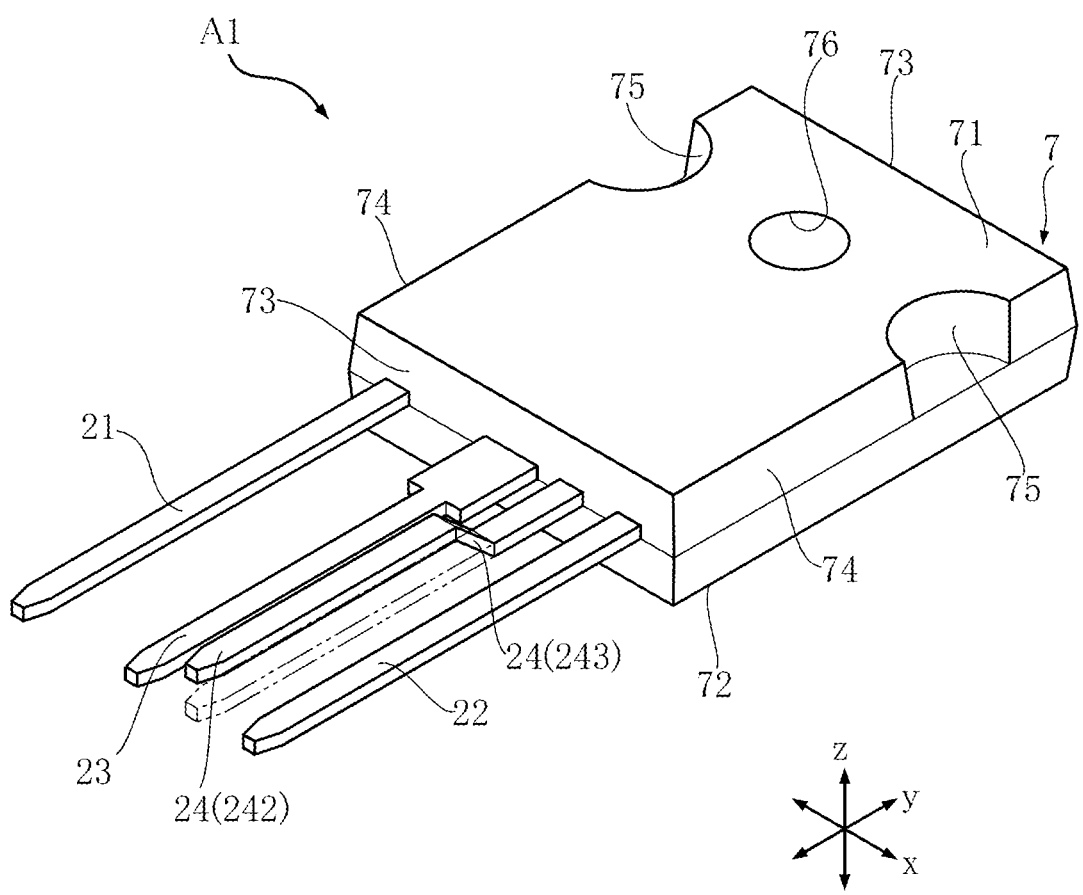
FIG. 1 is a perspective view showing a semiconductor device according to a first embodiment.

The following describes preferred embodiments of the present disclosure with reference to the drawings.

FIGS. 1 to 5 show a semiconductor device according to a first embodiment of the present disclosure. A semiconductor device A1 according to the present embodiment includes a switching element 1, a lead frame 2, a gate wire 52, a source wire 53, a first wire 61, a second wire 62, and a sealing resin 7.

Figure 2:
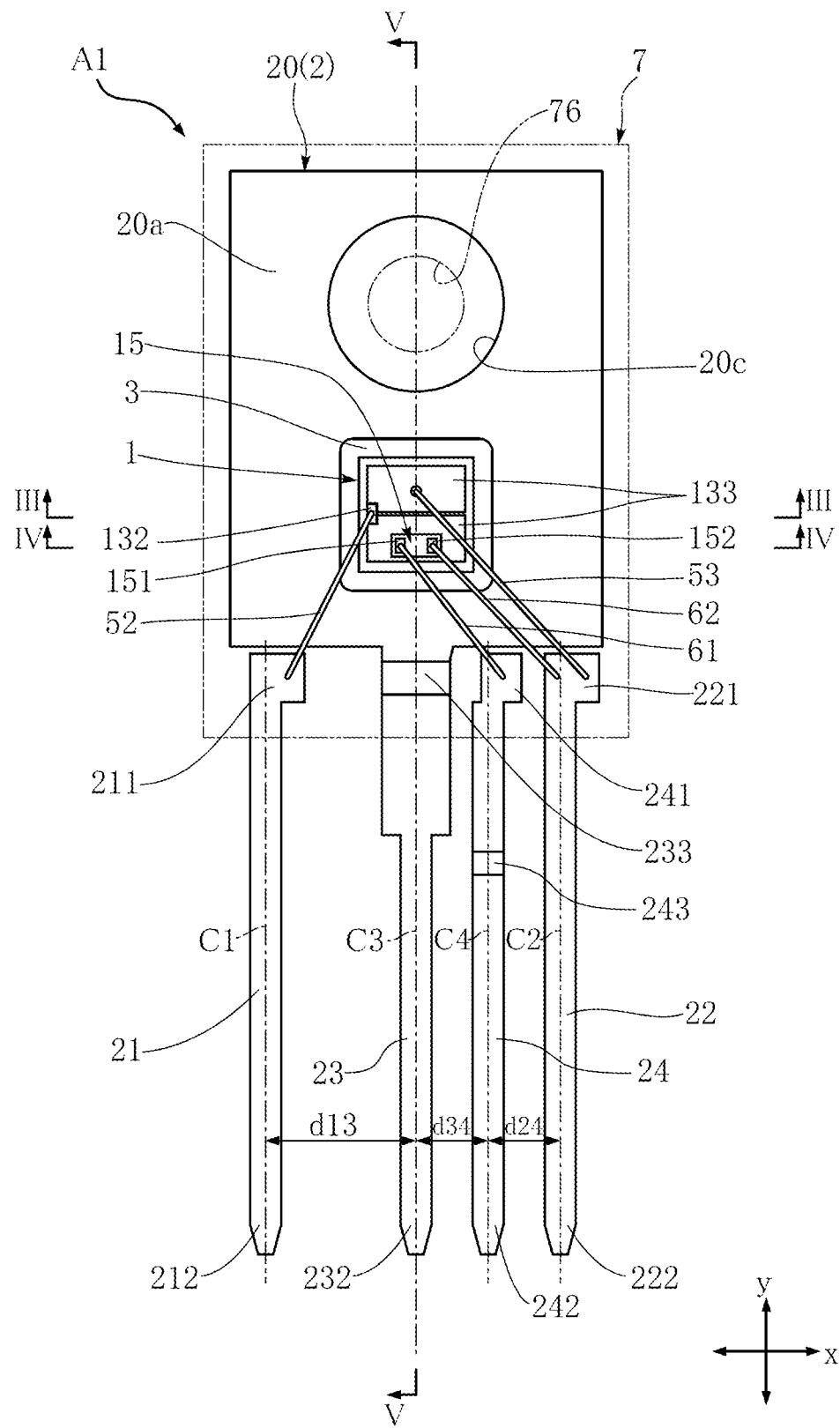
FIG. 2 is a plan view showing a semiconductor device A1 in FIG. 1.
Figure 3:
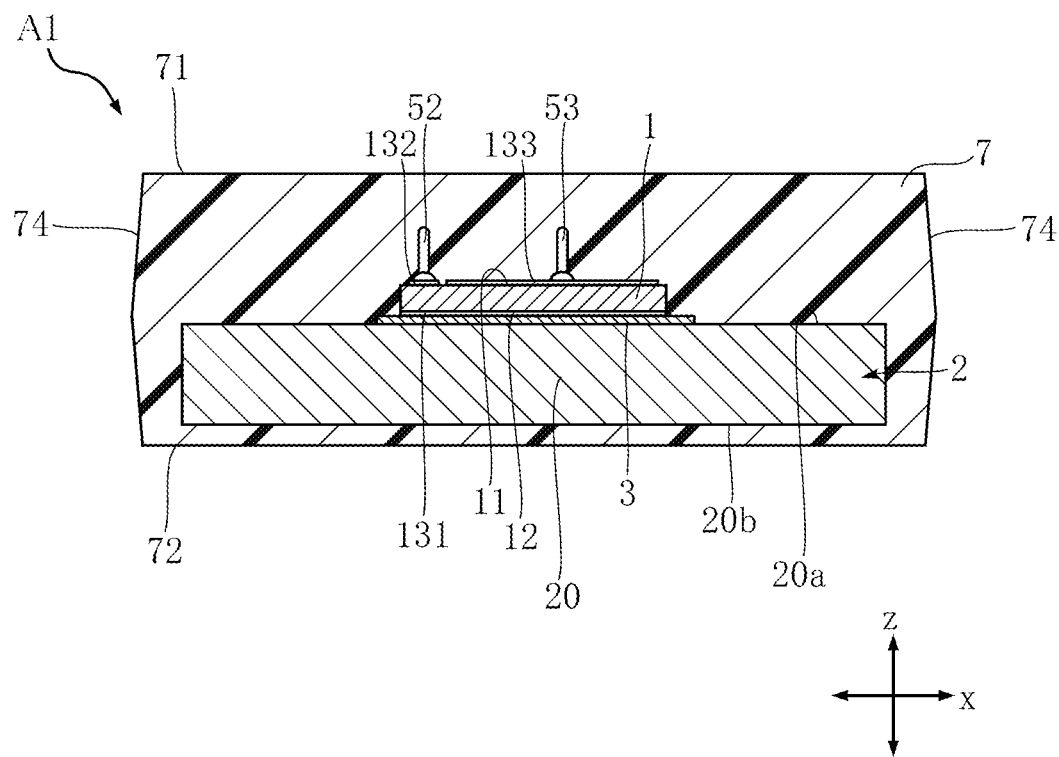
FIG. 3 is a cross-sectional view taken along line III-III in FIG. 2.
Figure 4:
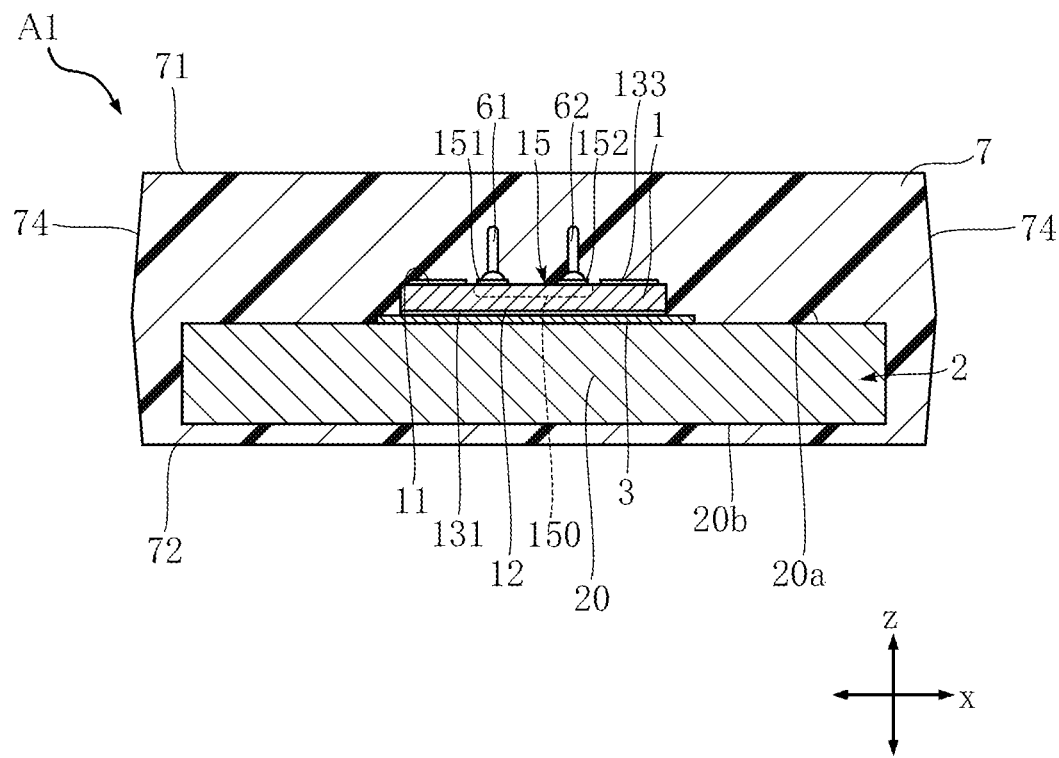
FIG. 4 is a cross-sectional view taken along line IV-IV in FIG. 2.
Figure 5:
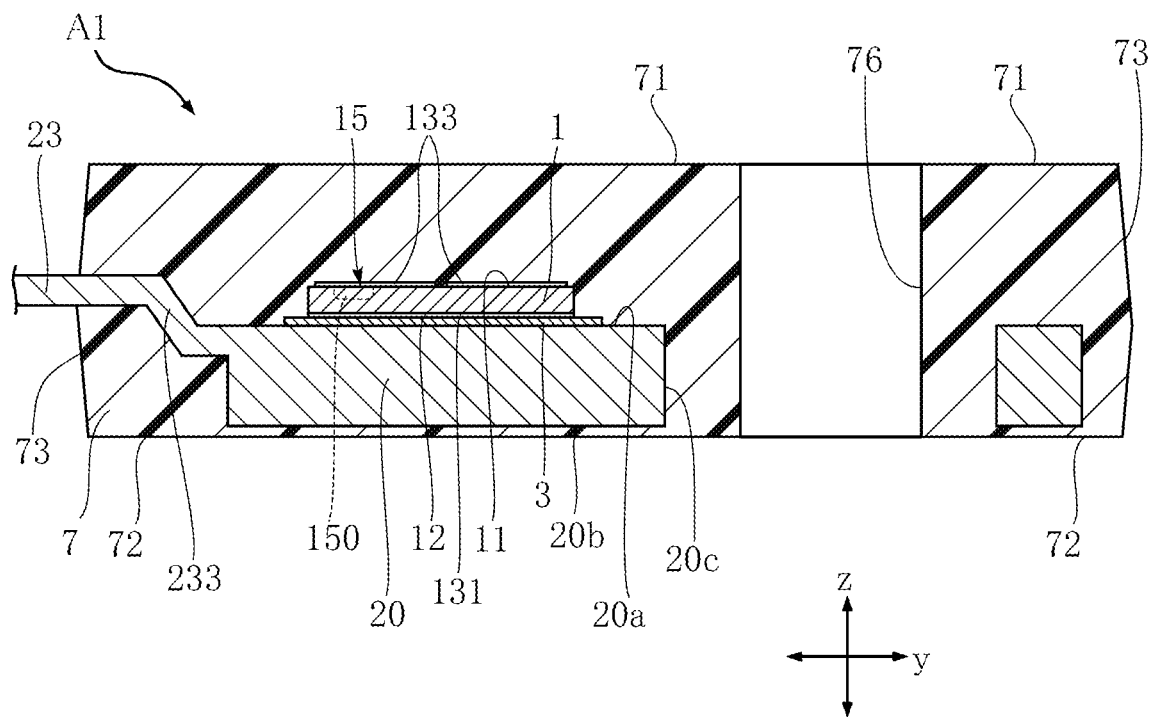
FIG. 5 is a cross-sectional view taken along line V-V in FIG. 2.

FIG. 1 is a perspective view showing the semiconductor device A1. FIG. 2 is a plan view showing the semiconductor device A1. FIG. 3 is a cross-sectional view taken along line III-III in FIG. 2. FIG. 4 is a cross-sectional view taken along line IV-IV in FIG. 2. FIG. 5 is a cross-sectional view taken along line V-V in FIG. 2. In FIG. 2, the sealing resin 7 is shown as transparent, and the sealing resin 7 is indicated by an imaginary line. For convenience of understanding, the thickness direction of the semiconductor device A1 is defined as a first direction z, the vertical direction in a plan view (FIG. 2), which is perpendicular to the first direction z, is defined as a second direction y, and the horizontal direction in a plan view (FIG. 2), which is perpendicular to both of the first direction z and the second direction y, is defined as a third direction x. Note that the terms "upper" and "lower" in the following description are used for convenience, and do not limit the posture of the semiconductor device A1 during installation.

The switching element 1 is made with the use of Si or Sic as a base material, and realizes the switching function of the semiconductor device A1. Examples of the switching element 1 include a SiC-MOSFET (Metal-Oxide-Semiconductor Field Effect Transistor), a SiC-bipolar transistor, a SiC-JFET (Junction Field Effect Transistor), and a SiC-IGBT (Insulated Gate Bipolar Transistor). In the present embodiment, description is given of the case where the switching element 1 is a SiC-MOSFET.

As shown in FIGS. 3 and 4, an element obverse surface 11 is the upper surface of the switching element 1. An element reverse surface 12 is the lower surface of the switching element 1. The element obverse surface 11 and the element reverse surface 12 face away from each other in the first direction z.

As shown in FIGS. 2 to 5, the switching element 1 includes a drain electrode 131, a gate electrode 132, and a source electrode 133. The switching element 1 includes a temperature sensor. In the illustrated example, the temperature sensor is a temperature detection diode 15, but the present disclosure is not limited to this.

The drain electrode 131 is arranged on the element reverse surface 12. The gate electrode 132 is arranged on the element obverse surface 11 (the surface opposite to the surface on which the drain electrode 131 is arranged). The source electrode 133 is arranged on the element obverse surface 11 (the same surface as the surface on which the gate electrode 132 is formed). The source electrode 133 is larger than the gate electrode 132. The switching element 1 applies a driving voltage to the gate electrode 132 and the source electrode 133 with a potential difference between the drain electrode 131 and the source electrode 133, thereby performing the on/off control of the drain electrode 131 and the source electrode 133.

The temperature detection diode 15 includes a pn junction diode portion 150 built into the switching element 1 by a semiconductor process, first electrode 151, and a second electrode 152. In the present embodiment, the pn junction diode portion 150 is formed near the element obverse surface 11, and the first electrode 151 and the second electrode 152 are arranged on the element obverse surface 11. In the present embodiment, the first electrode 151 is an anode electrode, and the second electrode 152 is a cathode electrode.

In the present embodiment, the switching element 1 has a rectangular shape as viewed in the thickness direction (as viewed in the first direction z). For example, the switching element 1 has a dimension of 1 mm to 10 mm square as viewed in the first direction z. The switching element 1 has a dimension of 40 μm to 700 μm in the thickness direction, for example.

The switching element 1 is supported by a die pad 20 described below via a bonding member 3. The bonding member 3 is a conductive bonding member formed with the use of TiNiAg solder, SnAgCu solder, Pb solder, or calcined Ag, for example, so as to electrically connect the drain electrode 131 of the switching element 1 and the die pad 20.

The lead frame 2 is a conductive member and bonded to a circuit board (not illustrated) to form a conductive path between the switching element 1 and the circuit board. The lead frame 2 is made of an alloy mainly containing Cu. A part of the surface may be plated for corrosion resistance, electrical conductivity, thermal conductivity, or a bonding property, for example. The lead frame 2 includes the die pad 20, a first terminal 21, a second terminal 22, a third terminal 23, and a fourth terminal 24, which are all made of the same lead frame material.

The die pad 20 has an obverse surface 20a and a reverse surface 20b. The obverse surface 20a is the upper surface of the die pad 20. The obverse surface 20a is the surface on which the switching element 1 is mounted. As shown in FIGS. 3 to 5, the element reverse surface 12 of the switching element 1 faces the obverse surface 20a. The reverse surface 20b is the lower surface of the die pad 20. The obverse surface 20a and the reverse surface 20b are flat and face away from each other in the first direction z.

In the present embodiment, the die pad 20 is formed with a through hole 20c extending from the obverse surface 20a to the reverse surface 20b. The through hole 20c is spaced apart from the switching element 1 as viewed in the thickness direction (as viewed in the first direction z). In the present embodiment, the through hole 20c has a circular shape as viewed in the thickness direction, but the shape thereof is not particularly limited. The die pad 20 is an example of a "base".

The first terminal 21, the second terminal 22, the third terminal 23, and the fourth terminal 24 are spaced apart from each other in the third direction x, and are used when the semiconductor device A1 is mounted on, e.g., a circuit board (not illustrated).

As shown in FIG. 2, the first terminal 21 is spaced apart from the die pad 20, and extends along the second direction y. The first terminal 21 is arranged at the outermost position (left side in the figure) in the third direction x as viewed in the first direction z. The first terminal 21 has a first pad 211 and a tip portion 212. The first pad 211 is closest to the die pad 20 in the second direction y. The tip portion 212 is the tip of the first terminal 21, which is located on the opposite side from the first pad 211, and is farthest from the die pad 20 in the second direction y. The gate wire 52 is bonded to the first pad 211. The first terminal 21 is electrically connected to the gate electrode 132 via the gate wire 52. In the present embodiment, the first terminal 21 is the gate terminal of the semiconductor device A1.

The second terminal 22 is spaced apart from the die pad 20, and extends along the second direction y. The second terminal 22 is arranged at the outermost position (right side in the figure) in the third direction x as viewed in the first direction z. As a result, the second terminal 22 and the first terminal 21 are located at the outermost positions that are opposite to each other in the third direction x. The second terminal 22 has a second pad 221 and a tip portion 222. The second pad 221 is closest to the die pad 20 in the second direction y. The tip portion 222 is the tip of the second terminal 22, which is located on the opposite side from the second pad 221, and is farthest from the die pad 20 in the second direction y. The source wire 53 is bonded to the second pad 221. The second terminal 22 is electrically connected to the source electrode 133 via the source wire 53. In the present embodiment, the second terminal 22 is the source terminal of the semiconductor device A1. The second wire 62 is bonded to the second pad 221. The second terminal 22 is electrically connected to the second electrode 152 via the second wire 62.

The third terminal 23 is connected to the die pad 20, and extends along the second direction y from the die pad 20. In the present embodiment, as shown in FIG. 2, the third terminal 23 is connected to one end of the die pad 20 in the second direction y (lower end in the figure) at the center of the die pad 20 in the third direction x, as viewed in the first direction z. The third terminal 23 is positioned between the first terminal 21 and the second terminal 22 in the third direction x. The third terminal 23 has an intermediate bent portion 233 and a tip portion 232. As shown in FIG. 5, the intermediate bent portion 233 is a portion of the third terminal 23 that is bent such that a portion of the third terminal 23 exposed from the sealing resin 7 is shifted upward in the figure from the die pad 20 in the first direction z. The tip portion 232 is the tip of the third terminal 23, and is farthest from the die pad 20 in the second direction y. The third terminal 23 is electrically connected to the drain electrode 131 via the die pad 20 and the bonding member 3. In the present embodiment, the third terminal 23 is the drain terminal of the semiconductor device A1.

The fourth terminal 24 is spaced apart from the die pad 20, and extends along the second direction y. The fourth terminal 24 is positioned between the second terminal 22 and the third terminal 23 as viewed in the first direction z. The fourth terminal 24 has a fourth pad 241, a tip portion 242, and a bent portion 243. The fourth pad 241 is closest to the die pad 20 in the second direction y. The tip portion 242 is the tip of the fourth terminal 24, which is located on the opposite side from the fourth pad 241, and is farthest from the die pad 20 in the second direction y. The bent portion 243 is positioned between the fourth pad 241 and the tip portion 242, and is closer to the fourth pad 241 in the second direction y.

As can be understood from FIGS. 1 and 2, the tip side of the fourth terminal 24 beyond the bent portion 243 is shifted to one side in the first direction z (the side to which the obverse surface 20a of the die pad 20 faces). With the fourth terminal 24 having the bent portion 243, the tip portion 242 of the fourth terminal 24 is shifted to the one side in the first direction z (the side to which the obverse surface 20a of the die pad 20 faces) as compared to the tip portions 212, 222, and 232 of the first terminal 21, the second terminal 22, and the third terminal 23. An imaginary line in FIG. 1 indicates the shape of the fourth terminal 24 different from the shape of the fourth terminal 24 in the present embodiment. Specifically, the imaginary line in FIG. 1 indicates the shape of the fourth terminal 24 when the fourth terminal 24 does not have the bent portion 243 and extends straight along the second direction y from the fourth pad 241 to the tip portion 242.

The first wire 61 is bonded to the fourth pad 241 of the fourth terminal 24. The fourth terminal 24 is electrically connected to the first electrode 151 via the first wire 61.

As shown in FIG. 2, the distance (first distance d13) in the third direction x between the center line C1 of the first terminal 21 (gate terminal) and the center line C3 of the third terminal 23 (drain terminal) is larger than the distance (second distance d34) in the third direction x between the center line C3 of the third terminal 23 (drain terminal) and the center line C4 of the fourth terminal 24. The first distance d13 is also larger than the distance (third distance d24) in the third direction x between the center line C4 of the fourth terminal 24 and the center line C2 of the second terminal 22 (source terminal). In the present embodiment, the second distance d34 and the third distance d24 are substantially the same. Also, the sum of the second distance d34 and the third distance d24 is substantially the same as the first distance d13.

As shown in FIG. 2, the gate wire 52 is bonded to the gate electrode 132 of the switching element 1 and the first pad 211 of the first terminal 21, and electrically connects the gate electrode 132 of the switching element 1 and the first terminal 21 to each other. In FIG. 4, the gate wire 52 is omitted.

The source wire 53 is bonded to the source electrode 133 of the switching element 1 and the second pad 221 of the second terminal 22, and electrically connects the source electrode 133 of the switching element 1 and the second terminal 22 to each other. In FIGS. 4 and 5, the source wire 53 is omitted.

The first wire 61 is bonded to the first electrode 151 of the switching element 1 (temperature detection diode 15) and the fourth pad 241 of the fourth terminal 24, and electrically connects the first electrode 151 of the temperature detection diode 15 and the fourth terminal 24 to each other. In FIG. 5, the first wire 61 is omitted.

The second wire 62 is bonded to the second electrode 152 of the switching element 1 (temperature detection diode 15) and the second pad 221 of the second terminal 22, and electrically connects the second electrode 152 of the temperature detection diode 15 and the second terminal 22 to each other.

The gate wire 52, the source wire 53, the first wire 61, and the second wire 62 are made of aluminum (Al), an Al alloy, Cu, or a Cu alloy, for example. Note that the source wire 53 may have a larger diameter than the other wires 52, 61, and 62. It is possible to provide a plurality of source wires 53.

The sealing resin 7 covers and protects the switching element 1, a part of the lead frame 2, the gate wire 52, the source wire 53, the first wire 61, and the second wire 62. Specifically, of the lead frame 2, the sealing resin 7 covers the die pad 20, a part of the first terminal 21 (mainly the first pad 211), a part of the second terminal 22 (mainly the second pad 221), a part of the third terminal 23 (mainly the intermediate bent portion 233), and a part of the fourth terminal 24 (mainly the fourth pad 241). The sealing resin 7 is a thermosetting synthetic resin that is electrically insulative. The material of the sealing resin 7 is not particularly limited. For example, the sealing resin 7 may be made of a black epoxy resin and mixed with fillers as appropriate.

In the present embodiment, the sealing resin 7 has a resin obverse surface 71, a resin reverse surface 72, a pair of resin first side surfaces 73, and a pair of resin second side surfaces 74. The resin obverse surface 71 is the upper surface of the sealing resin 7 shown in FIGS. 3 to 5, and faces in the same direction as the obverse surface 20a of the die pad 20. The resin reverse surface 72 is the lower surface of the sealing resin 7 shown in FIGS. 3 to 5, and faces in the same direction as the reverse surface 20b of the die pad 20. The resin obverse surface 71 and the resin reverse surface 72 face away from each other in the first direction z.

As shown in FIG. 5, the pair of resin first side surfaces 73 are spaced apart from each other in the second direction y. The pair of resin first side surfaces 73 face away from each other in the second direction y. As shown in FIG. 5, the upper end of each resin first side surface 73 is connected to the resin obverse surface 71, and the lower end of each resin first side surface 73 is connected to the resin reverse surface 72. In the present embodiment, the first terminal 21, the second terminal 22, the third terminal 23, and the fourth terminal 24 are partially exposed from one of the resin first side surfaces 73.

As shown in FIGS. 3 and 4, the pair of resin second side surfaces 74 are spaced apart from each other in the third direction x. The pair of resin second side surfaces 74 face away from each other in the third direction x. As shown in FIGS. 3 and 4, the upper end of each resin second side surface 74 is connected to the resin obverse surface 71, and the lower end of each resin second side surface 74 is connected to the resin reverse surface 72.

As shown in FIG. 1, the sealing resin 7 is formed with a pair of recesses 75 that are recessed into the sealing resin 7 from the upper portions of the pair of resin second side surfaces 74. As shown in FIGS. 1 and 5, the sealing resin 7 is formed with a resin through hole 76 extending from the resin obverse surface 71 to the resin reverse surface 72. In the present embodiment, the center of the resin through hole 76 coincides with the center of the through hole 20c in the die pad 20. The diameter of the resin through hole 76 is smaller than the diameter of the through hole 20c. In the present embodiment, the entire wall of the through hole 20c is covered with the sealing resin 7. Unlike the present embodiment, it is possible to have a configuration without the through hole 20c and the resin through hole 76. In the present embodiment, the reverse surface 20b of the die pad 20 is covered with the sealing resin 7 as shown in FIGS. 3 to 5. However, the reverse surface 20b may not be covered with the sealing resin 7, and may be exposed from the resin reverse surface 72 of the sealing resin 7.

In the present embodiment, the width (the dimension in the third direction x in FIG. 2) of the third terminal 23 near the base end thereof is larger than the width of each of the first terminal 21, second terminal 22, and the fourth terminal 24. However, the width of the third terminal 23 near the base end thereof may be approximately the same as the width of each of the first terminal 21, the second terminal 22, and the fourth terminal 24. In this case, the widths of the respective portions of the first terminal 21, the second terminal 22, the third terminal 23, and the fourth terminal 24 that are exposed from the sealing resin 7 are uniform.

Figure 6:
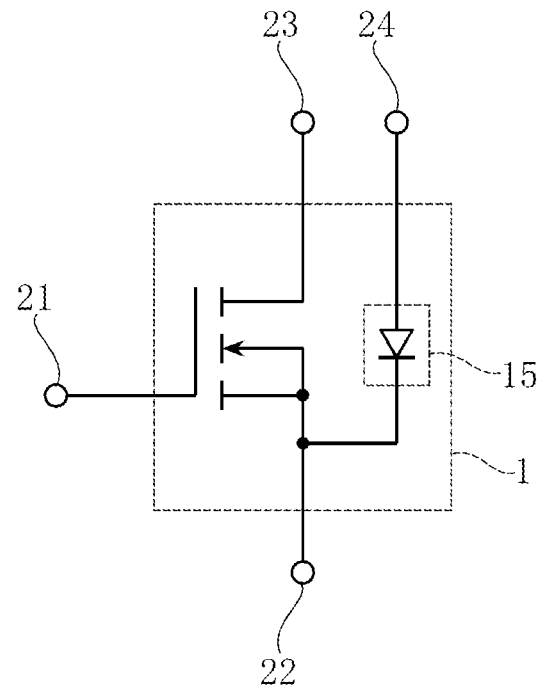
FIG. 6 shows the circuit configuration of the semiconductor device according to the first embodiment.

FIG. 6 is a block diagram showing the circuit configuration of the semiconductor device A1 of the present embodiment. As described with reference to FIG. 2, the fourth terminal 24 is electrically connected to the first electrode 151 of the temperature detection diode 15. The second terminal 22, which is a source terminal, is electrically connected to the second electrode 152 of the temperature detection diode 15.

The following describes advantages of the present embodiment.

The semiconductor device A1 according to the present embodiment includes the first terminal 21, the second terminal 22, and the third terminal 23, which correspond to the three terminals, i.e., the gate terminal, the source terminal, and the drain terminal, and also includes the fourth terminal 24. The switching element 1 includes the temperature detection diode 15, and the first electrode 151 of the temperature detection diode 15 is electrically connected to the fourth terminal 24 via the first wire 61. On the other hand, the second electrode 152 of the temperature detection diode 15 is electrically connected to another terminal (the second terminal 22 in the present embodiment) via the second wire 62. According to such a configuration, the junction temperature of the switching element 1 can be measured by supplying a current to the temperature detection diode 15 with the use of the fourth terminal 24 and the second terminal 22 that are electrically connected to the temperature detection diode 15, measuring the voltage, and using the temperature dependence of the resistance change of the diode. In the present embodiment, the fourth terminal 24, which is exclusively used for electrical connection with the temperature detection diode 15, is provided, whereby the junction temperature can be measured with the temperature detection diode 15 while the switching element 1 is driven.

In the present embodiment, the second electrode 152 of the temperature detection diode 15 is electrically connected to the second terminal 22, which is a source terminal. The source terminal (the second terminal 22) is connected to the ground, which is a reference potential, and the potential is stable at substantially 0 V. The second terminal 22 is also used as the terminal of the temperature detection diode 15, so that the junction temperature can be measured stably even when a current is supplied to the temperature detection diode 15. such a configuration is suitable for suppressing an increase in the number of terminals as well as measuring the junction temperature stably when driving the switching element 1.

Regarding the first terminal 21, the second terminal 22, and the third terminal 23 corresponding to the three terminals, i.e., the gate terminal, the source terminal, and the drain terminal, the first terminal 21 (gate terminal) and the second terminal 22 (source terminal) are at the outermost positions that are opposite to each other in the third direction x. The third terminal 23 (drain terminal) is positioned between the first terminal 21 and the second terminal 22 in the third direction x. According to such a configuration, the arrangement of the first terminal 21, the second terminal 22, and the third terminal 23 (the gate terminal, the source terminal, and the drain terminal) is the same as in a conventional three-terminal switching device (semiconductor device). This makes it easy to handle mounting on a circuit board or the like.

The first distance d13 in the third direction x between the center line C1 of the first terminal 21 and the center line C3 of the third terminal 23 is larger than the second distance d34 in the third direction x between the center line C3 of the third terminal 23 and the center line C4 of the fourth terminal 24, and is larger than the third distance d24 in the third direction x between the center line C4 of the fourth terminal 24 and the center line C2 of the second terminal 22. As a result, the fourth terminal 24 is positioned in the middle among the three terminals 23, 24, and 22 aligned at relatively small intervals. According to such a configuration, the fourth terminal 24, which is exclusively used for electrical connection with the temperature detection diode 15, can be easily distinguished from the other first to third terminals 21 to 23.

Regarding the fourth terminal 24, the tip side beyond the bent portion 243 is shifted to one side in the first direction z (the side to which the obverse surface 20a of the die pad 20 faces). According to such a configuration, the fourth terminal 24, which is exclusively used for electrical connection with the temperature detection diode 15, can be easily distinguished from the other first to third terminals 21 to 23. Furthermore, it is possible to ensure an appropriate creepage distance between the third terminal 23 (drain terminal) and the second terminal 22 (source terminal) by additionally covering, with an insulating resin applied through a potting process, the exposed part of the fourth terminal 24 that extends between the bent portion 243 and the sealing resin 7. In this case, withstand voltage can be increased for the third terminal 23 (drain terminal) and the second terminal 22 (source terminal).

The fourth terminal 24 may be configured without the bent portion 243. In this case, the fourth terminal 24 extends straight along the second direction y, as indicated by the imaginary line in FIG. 1, and the position of the fourth terminal 24 in the first direction z (the position in the vertical direction) is substantially aligned with the positions of the first terminal 21, the second terminal 22, and the third terminal 23 in the first direction z. The same applies to the variations described below, and the fourth terminal 24 can also be similarly configured without the bent portion 243.

Figure 7:
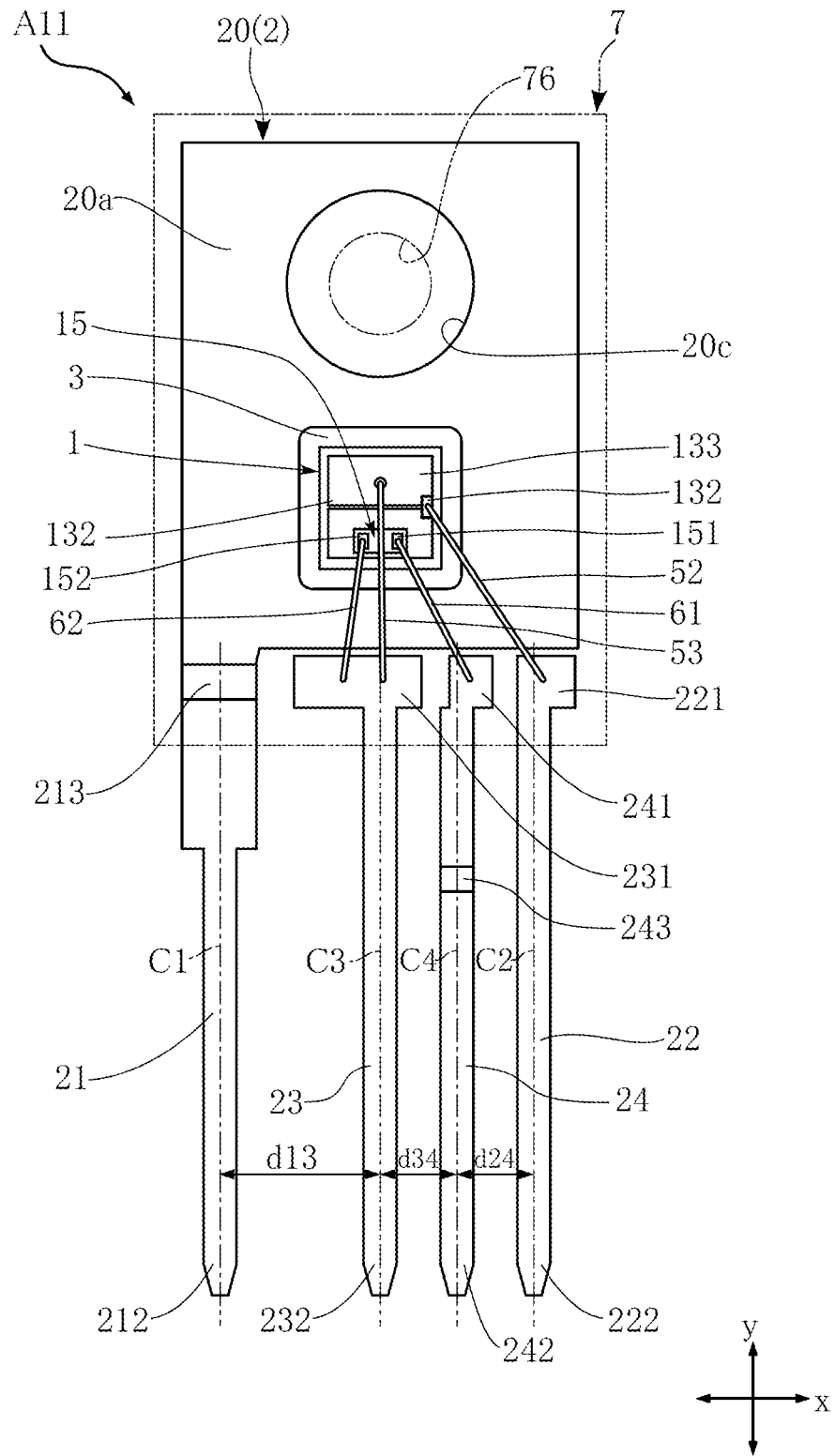
FIG. 7 is a plan view showing a variation of the semiconductor device according to the first embodiment.

FIG. 7 shows a first variation of the semiconductor device A1 according to the first embodiment. A semiconductor device A11 of the present variation is different from the semiconductor device A1 mainly in the configurations of the first terminal 21 and the third terminal 23, and in the bonding states of the gate wire 52, the source wire 53, and the second wire 62. In FIG. 7, the sealing resin 7 is shown as transparent, and the sealing resin 7 is indicated by an imaginary line. In FIG. 7 and the subsequent drawings, the elements that are identical or similar to those of the semiconductor device A1 in the above embodiment are designated by the same reference signs as in the above embodiment, and the descriptions thereof are omitted as appropriate.

In the semiconductor device A11 shown in FIG. 7, the first terminal 21 is connected to the die pad 20, and extends from the die pad 20 along the second direction y. As shown in FIG. 7, the first terminal 21 is connected to the die pad 20 at the left end in the third direction x in the figure. The first terminal 21 has an intermediate bent portion 213 and a tip portion 212. The intermediate bent portion 213 is a portion of the first terminal 21 that is bent such that a portion of the first terminal 21 exposed from the sealing resin 7 is shifted upward from the die pad 20 in the first direction z. The first terminal 21 is electrically connected to the drain electrode 131 via the die pad 20 and the bonding member 3. The first terminal 21 is the drain terminal of the semiconductor device A11.

The third terminal 23 is spaced apart from the die pad 20, and extends along the second direction y. The third terminal 23 has a third pad 231 and a tip portion 232. The third pad 231 is closest to the die pad 20 in the second direction y. The source wire 53 is bonded to the third pad 231. The third terminal 23 is electrically connected to the source electrode 133 via the source wire 53. The third terminal 23 is the source terminal of the semiconductor device A11. The second wire 62 is bonded to the third pad 231. The third terminal 23 is electrically connected to the second electrode 152 via the second wire 62.

The gate wire 52 is bonded to the second pad 221 of the second terminal 22. The second terminal 22 is electrically connected to the gate electrode 132 via the gate wire 52. The second terminal 22 is the gate terminal of the semiconductor device A11.

The gate wire 52 is bonded to the gate electrode 132 of the switching element 1 and the second pad 221 of the second terminal 22, and electrically connects the gate electrode 132 of the switching element 1 and the second terminal 22 to each other. The source wire 53 is bonded to the source electrode 133 of the switching element 1 and the third pad 231 of the third terminal 23, and electrically connects the source electrode 133 of the switching element 1 and the third terminal 23 to each other. The first wire 61 is bonded to the first electrode 151 of the switching element 1 (temperature detection diode 15) and the fourth pad 241 of the fourth terminal 24, and electrically connects the first electrode 151 of the temperature detection diode 15 and the fourth terminal 24 to each other. The second wire 62 is bonded to the second electrode 152 of the switching element 1 (temperature detection diode 15) and the third pad 231 of the third terminal 23, and electrically connects the second electrode 152 of the temperature detection diode 15 and the third terminal 23 to each other.

The semiconductor device A11 includes the first terminal 21, the second terminal 22, and the third terminal 23, which correspond to the three terminals, i.e., the drain terminal, the gate terminal, and the source terminal, and also includes the fourth terminal 24. The switching element 1 includes the temperature detection diode 15, and the first electrode 151 of the temperature detection diode 15 is electrically connected to the fourth terminal 24 via the first wire 61. On the other hand, the second electrode 152 of the temperature detection diode 15 is electrically connected to another terminal (the third terminal 23 in the present variation) via the second wire 62. According to such a configuration, the junction temperature of the switching element 1 can be measured by supplying a current to the temperature detection diode 15 with the use of the fourth terminal 24 and the third terminal 23 that are electrically connected to the temperature detection diode 15, measuring the voltage, and using the temperature dependence of the resistance change of the diode. In the present variation, the fourth terminal 24, which is exclusively used for electrical connection with the temperature detection diode 15, is provided, whereby the junction temperature can be measured with the temperature detection diode 15 while the switching element 1 is driven.

In the present variation, the second electrode 152 of the temperature detection diode 15 is electrically connected to the third terminal 23, which is a source terminal. The source terminal (the third terminal 23) is connected to the ground, which is a reference potential, and the potential is stable at substantially 0 V. The third terminal 23 is also used as the terminal of the temperature detection diode 15, so that the junction temperature can be measured stably even when a current is supplied to the temperature detection diode 15. such a configuration is suitable for suppressing an increase in the number of terminals as well as measuring the junction temperature stably when driving the switching element 1.

The first distance d13 in the third direction x between the center line C1 of the first terminal 21 and the center line C3 of the third terminal 23 is larger than the second distance d34 in the third direction x between the center line C3 of the third terminal 23 and the center line C4 of the fourth terminal 24, and is larger than the third distance d24 in the third direction x between the center line C4 of the fourth terminal 24 and the center line C2 of the second terminal 22. As a result, the fourth terminal 24 is positioned in the middle among the three terminals 23, 24, and 22 aligned at relatively small intervals. According to such a configuration, the fourth terminal 24, which is exclusively used for electrical connection with the temperature detection diode 15, can be easily distinguished from the other first to third terminals 21 to 23.

As shown in FIG. 7, the third terminal 23, which is a source terminal, is adjacent to the first terminal 21, which is a drain terminal, in the third direction x as viewed in the first direction z. The first distance d13 between the first terminal 21 and the third terminal 23 in the third direction x is relatively large, so that the creepage distance between the first terminal 21 (drain terminal) and the third terminal 23

(source terminal) can be appropriately provided. This makes it possible to increase withstand voltage for the first terminal 21 (drain terminal) and the third terminal 23 (source terminal).

Figure 8:
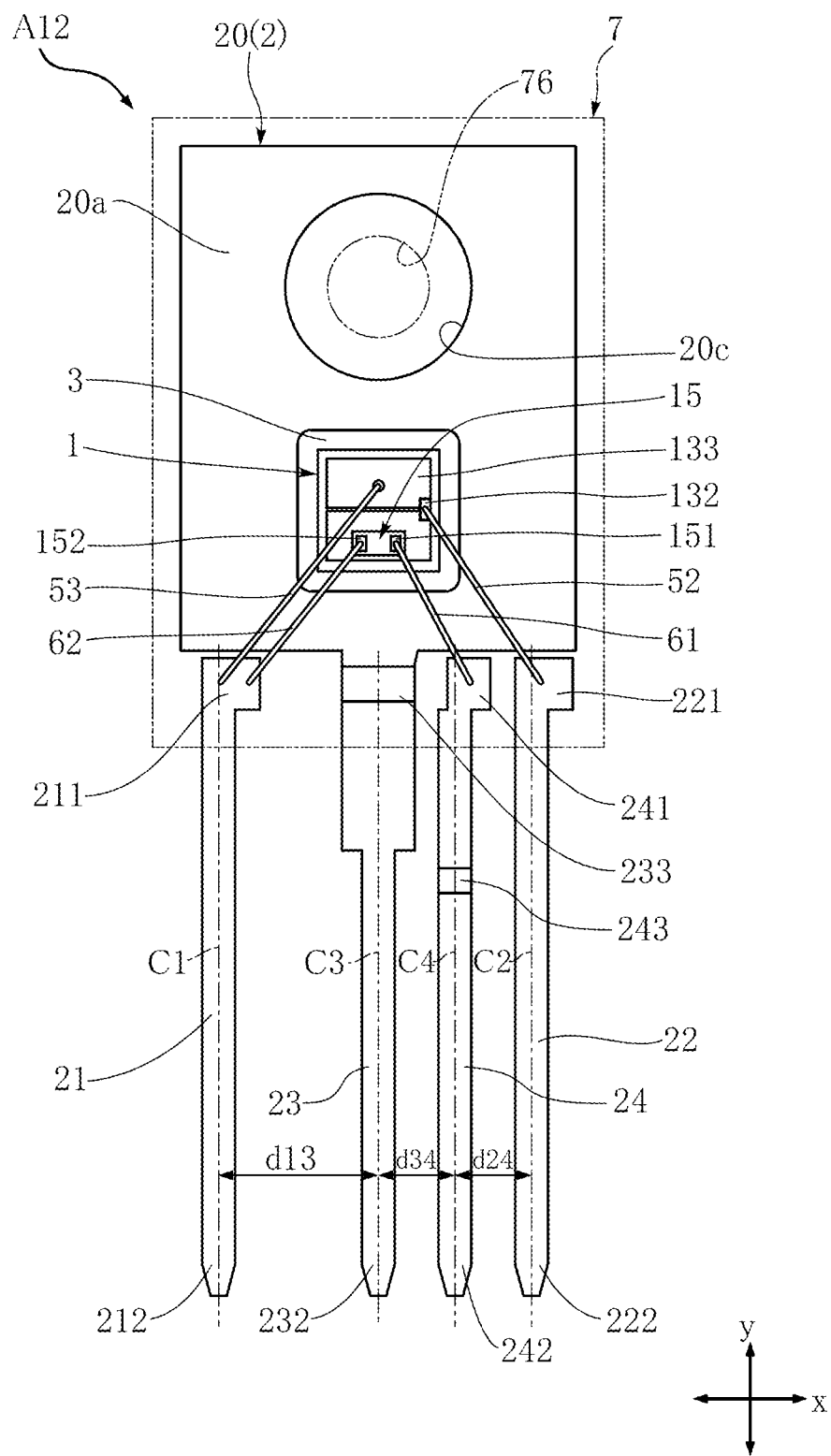
FIG. 8 is a plan view showing a variation of the semiconductor device according to the first embodiment.

FIG. 8 shows a second variation of the semiconductor device A1 according to the first embodiment. A semiconductor device A12 of the present variation is different from the semiconductor device A1 in the bonding states of the gate wire 52, the source wire 53, and the second wire 62. In FIG. 8, the sealing resin 7 is shown as transparent, and the sealing resin 7 is indicated by an imaginary line.

In the semiconductor device A12 shown in FIG. 8, the first terminal 21, the second terminal 22, the third terminal 23, and the fourth terminal 24 are configured the same as the semiconductor device A1 (see FIG. 2).

The source wire 53 is bonded to the first pad 211 of the first terminal 21. The first terminal 21 is electrically connected to the source electrode 133 via the source wire 53. The first terminal 21 is the source terminal of the semiconductor device A12. The second wire 62 is bonded to the first pad 211. The first terminal 21 is electrically connected to the second electrode 152 via the second wire 62.

The gate wire 52 is bonded to the second pad 221 of the second terminal. The second terminal 22 is electrically connected to the gate electrode 132 via the gate wire 52. The second terminal 22 is the gate terminal of the semiconductor device A12.

The third terminal 23 is electrically connected to the drain electrode 131 via the die pad 20 and the bonding member 3. The third terminal 23 is the drain terminal of the semiconductor device A12.

The gate wire 52 is bonded to the gate electrode 132 of the switching element 1 and the second pad 221 of the second terminal 22, and electrically connects the gate electrode 132 of the switching element 1 and the second terminal 22 to each other. The source wire 53 is bonded to the source electrode 133 of the switching element 1 and the first pad 211 of the first terminal 21, and electrically connects the source electrode 133 of the switching element 1 and the first terminal 21 to each other. The first wire 61 is bonded to the first electrode 151 of the switching element 1 (temperature detection diode 15) and the fourth pad 241 of the fourth terminal 24, and electrically connects the first electrode 151 of the temperature detection diode 15 and the fourth terminal 24 to each other. The second wire 62 is bonded to the second electrode 152 of the switching element 1 (temperature detection diode 15) and the first pad 211 of the first terminal 21, and electrically connects the second electrode 152 of the temperature detection diode 15 and the first terminal 21 to each other.

The semiconductor device A12 includes the first terminal 21, the second terminal 22, and the third terminal 23, which correspond to the three terminals, i.e., the source terminal, the gate terminal, and the drain terminal, and also includes the fourth terminal 24. The switching element 1 includes the temperature detection diode 15, and the first electrode 151 of the temperature detection diode 15 is electrically connected to the fourth terminal 24 via the first wire 61. On the other hand, the second electrode 152 of the temperature detection diode 15 is electrically connected to another terminal (the first terminal 21 in the present variation) via the second wire 62. According to such a configuration, the junction temperature of the switching element 1 can be measured by supplying a current to the temperature detection diode 15 with the use of the fourth terminal 24 and the first terminal 21 that are electrically connected to the temperature detection diode 15, measuring the voltage, and using the temperature dependence of the resistance change of the diode. In the present variation, the fourth terminal 24, which is exclusively used for electrical connection with the temperature detection diode 15, is provided, whereby the junction temperature can be measured with the temperature detection diode 15 while the switching element 1 is driven.

In the present variation, the second electrode 152 of the temperature detection diode 15 is electrically connected to the first terminal 21, which is a source terminal. The source terminal (the first terminal 21) is connected to the ground, which is a reference potential, and the potential is stable at substantially 0 V. The first terminal 21 is also used as the terminal of the temperature detection diode 15, so that the junction temperature can be measured stably even when a current is supplied to the temperature detection diode 15. Such a configuration is suitable for suppressing an increase in the number of terminals as well as measuring the junction temperature stably when driving the switching element 1.

Regarding the first terminal 21, the second terminal 22, and the third terminal 23 corresponding to the three terminals, i.e., the source terminal, the gate terminal, and the drain terminal, the first terminal 21 (source terminal) and the second terminal 22 (gate terminal) are at the outermost positions that are opposite to each other in the third direction x. The third terminal 23 (drain terminal) is positioned between the first terminal 21 and the second terminal 22 in the third direction x. According to such a configuration, the arrangement of the first terminal 21, the second terminal 22, and the third terminal 23 (the source terminal, the gate terminal, and the drain terminal) is the same as in a conventional three-terminal switching device (semiconductor device). This makes it easy to handle mounting on a circuit board or the like.

The first distance d13 in the third direction x between the center line C1 of the first terminal 21 and the center line C3 of the third terminal 23 is larger than the second distance d34 in the third direction x between the center line C3 of the third terminal 23 and the center line C4 of the fourth terminal 24, and is larger than the third distance d24 in the third direction x between the center line C4 of the fourth terminal 24 and the center line C2 of the second terminal 22. As a result, the fourth terminal 24 is positioned in the middle among the three terminals 23, 24, and 22 aligned at relatively small intervals. According to such a configuration, the fourth terminal 24, which is exclusively used for electrical connection with the temperature detection diode 15, can be easily distinguished from the other first to third terminals 21 to 23.

As shown in FIG. 8, the first terminal 21, which is a source terminal, is adjacent to the third terminal 23, which is a drain terminal, in the third direction x as viewed in the first direction z. The first distance d13 between the first terminal 21 and the third terminal 23 in the third direction x is relatively large, so that the creepage distance between the first terminal 21 (source terminal) and the third terminal 23 (drain terminal) can be appropriately provided. This makes it possible to increase withstand voltage for the first terminal 21 (source terminal) and the third terminal 23 (drain terminal).

Figure 9:
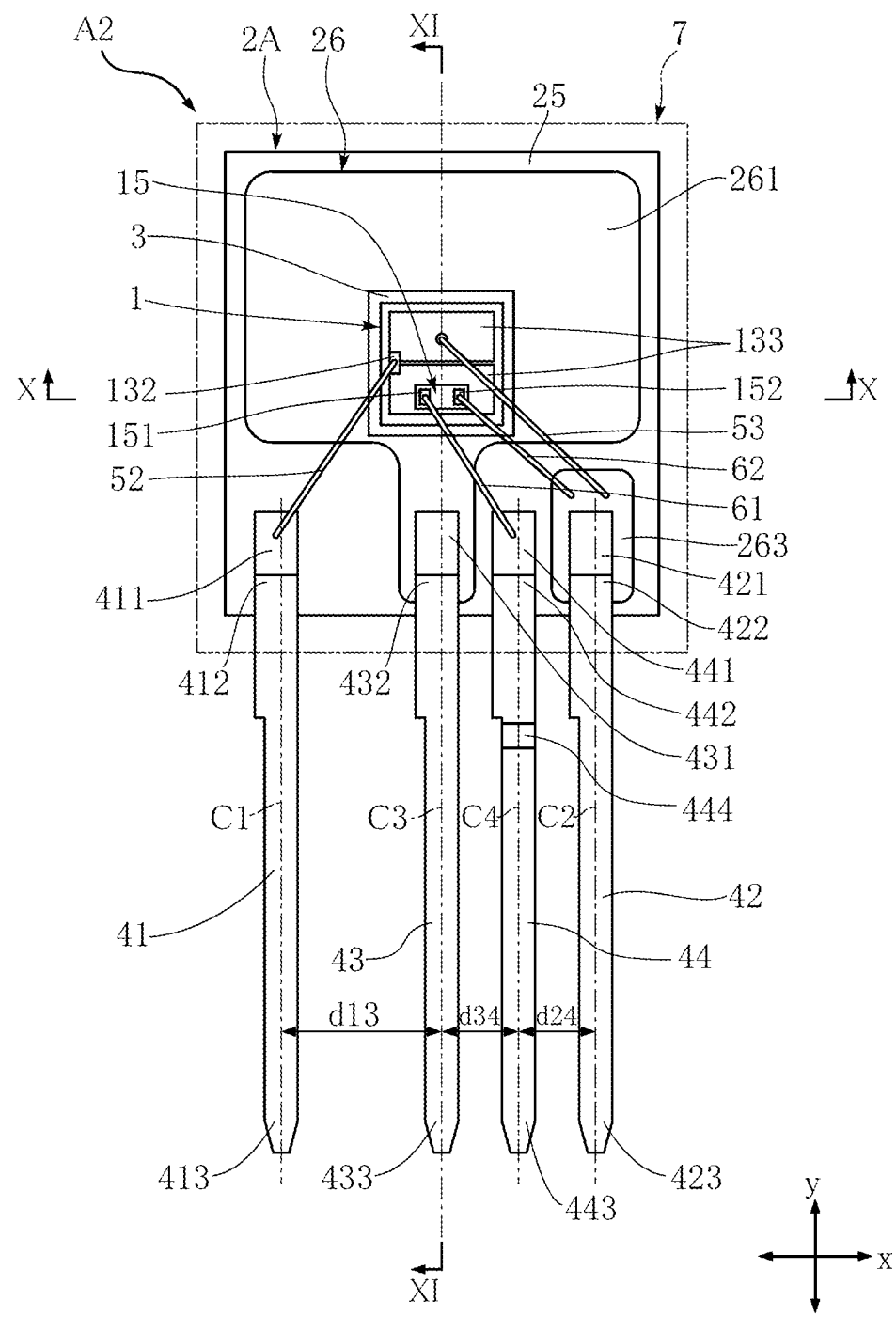
FIG. 9 is a plan view showing a semiconductor device according to a second embodiment.
Figure 10:
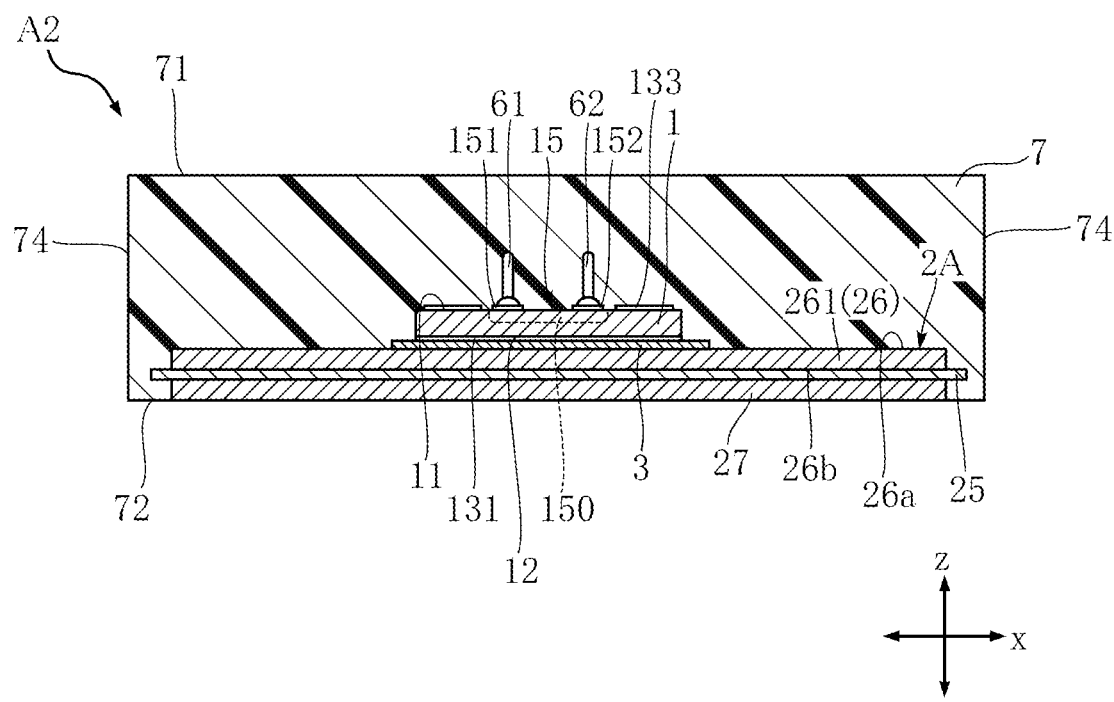
FIG. 10 is a cross-sectional view taken along line X-X in FIG. 9.
Figure 11:
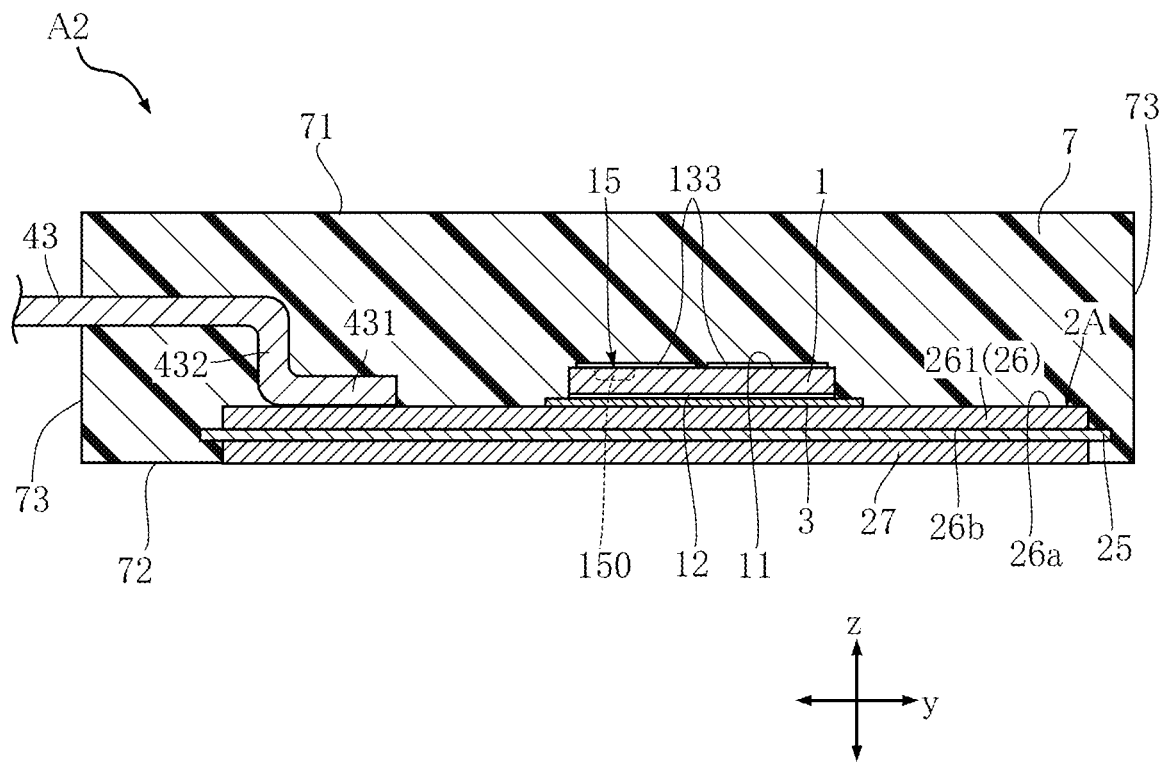
FIG. 11 is a cross-sectional view taken along line XI-XI in FIG. 9.

FIGS. 9 to 11 show a semiconductor device according to a second embodiment of the present disclosure. A semiconductor device A2 of the present embodiment includes a substrate 2A, a first terminal 41, a second terminal 42, a third terminal 43, and a fourth terminal 44, instead of the lead frame 2 of the above embodiment. In FIG. 9, the sealing resin 7 is shown as transparent, and the sealing resin 7 is indicated by an imaginary line.

In the present embodiment, the substrate 2A includes an insulating layer 25, an obverse-surface conductive layer 26, and a reverse-surface metal layer 27. The insulating layer 25 is a plate-like member made of an insulating material. The insulating layer 25 has a rectangular shape as viewed in the first direction z. The material of the substrate 2A is not particularly limited. For example, the substrate 2A may be made of a ceramic material such as alumina, aluminum nitride, silicon nitride, boron nitride, or graphite.

The obverse-surface conductive layer 26 forms the upper surface of the substrate 2A, and is mainly for forming a conductive path to the switching element 1. The material of the obverse-surface conductive layer 26 is not particularly limited. For example, the obverse-surface conductive layer 26 may be made of a metal such as Cu or an alloy thereof, and may include a plating layer made of Ni or Ag as necessary. The method for forming the obverse-surface conductive layer 26 is not particularly limited. For example, a metal plate member may be bonded to the upper surface of the insulating layer 25.

As shown in FIGS. 10 and 11, the obverse-surface conductive layer 26 has an obverse surface 26a and a reverse surface 26b. The obverse surface 26a is the upper surface of the obverse-surface conductive layer 26. The obverse surface 26a (a part of the obverse surface 26a corresponding to a drain electrode portion 261 described below) is a surface on which the switching element 1 is mounted. The element reverse surface 12 of the switching element 1 faces the obverse surface 26a. The reverse surface 26b is the lower surface of the obverse-surface conductive layer 26. The obverse surface 26a and the reverse surface 26b are flat and face away from each other in the first direction z.

The obverse-surface conductive layer 26 has a drain electrode portion 261 and a source electrode portion 263.

The drain electrode portion 261 is a portion on which the switching element 1 is mounted, and to which the third terminal 43 is bonded. The switching element 1 is supported by the insulating layer 25 and the drain electrode portion 261 (obverse-surface conductive layer 26) via the bonding member 3. In the present embodiment, the drain electrode portion 261 has a size that occupies most of the obverse-surface conductive layer 26. The source electrode portion 263 is a portion that is electrically connected to the source electrode 133 of the switching element 1, and to which the second terminal 42 is bonded. The source electrode portion 263 is spaced apart from the drain electrode portion 261. The obverse-surface conductive layer 26 configured as described above is an example of a "base".

As shown in FIGS. 10 and 11, the reverse-surface metal layer 27 forms the lower surface of the substrate 2A. The reverse-surface metal layer 27 is insulated from the drain electrode portion 261 and the switching element 1. In the present embodiment, the reverse-surface metal layer 27 is formed to have the size and shape that cover the most of the lower surface of insulating layer 25. Hence, the reverse-surface metal layer 27 overlaps with almost the entirety of the drain electrode portion 261 and thus the switching element 1 as viewed in the first direction z.

The first terminal 41, the second terminal 42, the third terminal 43, and the fourth terminal 44 form a conductive path between the outside of the semiconductor device A2 and the switching element 1. These terminals 41 to 44 are spaced apart from each other in the third direction x, and are used when the semiconductor device A2 is mounted on, e.g., a circuit board (not illustrated).

As shown in FIG. 9, the first terminal 41 extends along the second direction y, and has a bonding portion 411, a bent portion 412, and a tip portion 413. The bonding portion 411 is the root of the first terminal 41, and is bonded to the upper surface of the substrate 2A. The method for bonding the bonding portion 411 to the upper surface of the substrate 2A is not particularly limited. For example, the bonding may be performed with a suitable bonding material selected from among various bonding materials. The bent portion 412 is bent and connected to the bonding portion 411, and has a shape that separates the portion between the bent portion 412 and the tip portion 413 apart from the reverse-surface metal layer 27 in the first direction z. The tip portion 413 is the tip of the first terminal 41, and is located opposite to the bonding portion 411. The gate wire 52 is bonded to the bonding portion 411. The first terminal 41 is electrically connected to the gate electrode 132 via the gate wire 52. In the present embodiment, the first terminal 41 is the gate terminal of the semiconductor device A2.

The second terminal 42 extends along the second direction y, and is arranged at the outermost portion (right side in the figure) in the third direction x as viewed in the first direction z. The second terminal 42 has a bonding portion 421, a bent portion 422, and a tip portion 423. The bonding portion 421 is the root of the second terminal 42, and is bonded to the source electrode portion 263. The method for bonding the bonding portion 421 and the source electrode portion 263 is not particularly limited, and may be selected appropriately from among various methods such as bonding with a conductive bonding material, ultrasonic bonding, and resistance welding. In the present embodiment, the bonding is performed with a conductive bonding material. The bent portion 422 is bent and connected to the bonding portion 421, and has a shape that separates the portion between the bent portion 422 and the tip portion 423 apart from the reverse-surface metal layer 27 in the first direction z. The tip portion 423 is the tip of the second terminal 42, and is located opposite to the bonding portion 421. The source wire 53 is bonded to the source electrode portion 263. The second terminal 42 is electrically connected to the source electrode 133 via the source electrode portion 263 and the source wire 53. In the present embodiment, the second terminal 42 is the source terminal of the semiconductor device A2. The second wire 62 is bonded to the source electrode portion 263. The second terminal 42 is electrically connected to the second electrode 152 via the source electrode portion 263 and the second wire 62.

The third terminal 43 extends along the second direction y, and is arranged between the first terminal 41 and the second terminal 42 in the third direction x as viewed in the first direction z. The third terminal 43 has a bonding portion 431, a bent portion 432, and a tip portion 433. The bonding portion 431 is the root of the third terminal 43, and is bonded to the drain electrode portion 261. The method for bonding the bonding portion 431 and the drain electrode portion 261 is not particularly limited, and may be selected appropriately from among various methods such as bonding with a conductive bonding material, ultrasonic bonding, and resistance welding. In the present embodiment, the bonding is performed with a conductive bonding material. The bent portion 432 is bent and connected to the bonding portion 431, and has a shape that separates the portion between the bent portion 432 and the tip portion 433 apart from the reverse-surface metal layer 27 in the first direction z. The tip portion 433 is the tip of the third terminal 43, and is located opposite to the bonding portion 431. The second terminal 42 is electrically connected to the drain electrode 131 via the drain electrode portion 261 and the bonding member 3. In the present embodiment, the third terminal 43 is the drain terminal of the semiconductor device A2.

The fourth terminal 44 extends along the second direction y, and is arranged between the second terminal 42 and the third terminal 43 in the third direction x as viewed in the first direction z. The fourth terminal 44 has a bonding portion 441, a bent portion 442, a tip portion 443, and a bent portion 444. The bonding portion 441 is the root of the fourth terminal 44, and is bonded to the upper surface of the substrate 2A. The method for bonding the bonding portion 441 to the upper surface of the substrate 2A is not particularly limited. For example, the bonding may be performed with a suitable bonding material selected from among various bonding materials. The bent portion 442 is bent and connected to the bonding portion 441, and has a shape that separates the portion between the bent portion 442 and the tip portion 443 apart from the reverse-surface metal layer 27 in the first direction z. The tip portion 443 is the tip of the fourth terminal 44, and is located opposite to the bonding portion 441. The bent portion 444 is positioned between the bent portion 442 and the tip portion 443, and is closer to the bent portion 442.

The bent portion 444 has a shape that separates the portion between the bent portion 444 and the tip portion 443 apart from the reverse-surface metal layer 27 in the first direction z. As a result, the tip side of the fourth terminal 44, which is the portion beyond the bent portion 444, is shifted to one side in the first direction z (the side to which the obverse surface 26a of the obverse-surface conductive layer 26 faces). With the fourth terminal 44 having the bent portion 444, the tip portion 443 of the fourth terminal 44 is shifted to one side in the first direction z (the side to which the obverse surface 26a of the obverse-surface conductive layer 26 faces) as compared to the tip portions 413, 423, and 433 of the first terminal 41, the second terminal 42, and the third terminal 43.

The first wire 61 is bonded to the bonding portion 441 of the fourth terminal 44. The fourth terminal 44 is electrically connected to the first electrode 151 via the first wire 61.

As shown in FIG. 9, the distance (first distance d13) in the third direction x between the center line C1 of the first terminal 41 (gate terminal) and the center line C3 of the third terminal 43 (drain terminal) is larger than the distance (second distance d34) in the third direction x between the center line C3 of the third terminal 43 (drain terminal) and the center line C4 of the fourth terminal 44. The first distance d13 is also larger than the distance (third distance d24) in the third direction x between the center line C4 of the fourth terminal 44 and the center line C2 of the second terminal 42 (source terminal). In the present embodiment, the second distance d34 and the third distance d24 are substantially the same. Also, the sum of the second distance d34 and the third distance d24 is substantially the same as the first distance d13.

As shown in FIG. 9, the gate wire 52 is bonded to the gate electrode 132 of the switching element 1 and the bonding portion 411 of the first terminal 41, and electrically connects the gate electrode 132 of the switching element 1 and the first terminal 41 to each other. In FIG. 10, the gate wire 52 is omitted.

The source wire 53 is bonded to the source electrode 133 of the switching element 1 and the source electrode portion 263, and electrically connects the source electrode 133 of the switching element 1 and the second terminal 42 to each other. In FIGS. 10 and 11, the source wire 53 is omitted.

The first wire 61 is bonded to the first electrode 151 of the switching element 1 (temperature detection diode 15) and the bonding portion 441 of the fourth terminal 44, and electrically connects the first electrode 151 of the temperature detection diode 15 and the fourth terminal 44 to each other. In FIG. 11, the first wire 61 is omitted.

The second wire 62 is bonded to the second electrode 152 of the switching element 1 (temperature detection diode 15) and the source electrode portion 263 of the second terminal 42, and electrically connects the second electrode 152 of the temperature detection diode 15 and the second terminal 42.

The sealing resin 7 covers and protects the switching element 1, a part of the substrate 2A, a part of the first terminal 41, a part of the second terminal 42, a part of the third terminal 43, a part of the fourth terminal 44, the gate wire 52, the source wire 53, the first wire 61, and the second wire 62.

In the present embodiment, the sealing resin 7 has a resin obverse surface 71, a resin reverse surface 72, a pair of resin first side surfaces 73, and a pair of resin second side surfaces 74. The resin obverse surface 71 is the upper surface of the sealing resin 7 shown in FIGS. 10 and 11, and faces in the same direction as the obverse surface 26a of the obverse-surface conductive layer 26. The resin reverse surface 72 is the lower surface of the sealing resin 7 shown in FIGS. 10 and 11, and faces in the same direction as the reverse surface 26b of the obverse-surface conductive layer 26. The resin obverse surface 71 and the resin reverse surface 72 face away from each other in the first direction z.

As shown in FIGS. 10 and 11, in the present embodiment, one surface of the reverse-surface metal layer 27 is entirely exposed from the resin reverse surface 72 of the sealing resin 7. The surface of the reverse-surface metal layer 27 is flush with the resin reverse surface 72.

As shown in FIG. 11, the pair of resin first side surfaces 73 are spaced apart from each other in the second direction y. The pair of resin first side surfaces 73 face away from each other in the second direction y. As shown in FIG. 11, the upper end of each resin first side surface 73 is connected to the resin obverse surface 71, and the lower end of each resin first side surface 73 is connected to the resin reverse surface 72. In the present embodiment, the first terminal 41, the second terminal 42, the third terminal 43, and the fourth terminal partially exposed from one of the resin first side surfaces 73.

As shown in FIG. 10, the pair of resin second side surfaces 74 are spaced apart from each other in the third direction x. The pair of resin second side surfaces 74 face away from each other in the third direction x. As shown in FIG. 10, the upper end of each resin second side surface 74 is connected to the resin obverse surface 71, and the lower end of each resin second side surface 74 is connected to the resin reverse surface 72.

The following describes advantages of the present embodiment.

The semiconductor device A2 according to the present embodiment includes the first terminal 41, the second terminal 42, and the third terminal 43, which correspond to the three terminals, i.e., the gate terminal, the source terminal, and the drain terminal, and also includes the fourth terminal 44. The switching element 1 includes the temperature detection diode 15, and the first electrode 151 of the temperature detection diode 15 is electrically connected to the fourth terminal 44 via the first wire 61. On the other hand, the second electrode 152 of the temperature detection diode 15 is electrically connected to another terminal (the second terminal 42 in the present embodiment) via the second wire 62. According to such a configuration, the junction temperature of the switching element 1 can be measured by supplying a current to the temperature detection diode 15 with the use of the fourth terminal 44 and the second terminal 42 that are electrically connected to the temperature detection diode 15, measuring the voltage, and using the temperature dependence of the resistance change of the diode. In the present variation, the fourth terminal 44, which is exclusively used for electrical connection with the temperature detection diode 15, is provided, whereby the junction temperature can be measured with the temperature detection diode 15 while the switching element 1 is driven.

In the present embodiment, the second electrode 152 of the temperature detection diode 15 is electrically connected to the second terminal 42, which is a source terminal. The source terminal (the second terminal 42) is connected to the ground, which is a reference potential, and the potential is stable at substantially 0 V. The second terminal 42 is also used as the terminal of the temperature detection diode 15, so that the junction temperature can be measured stably even when a current is supplied to the temperature detection diode 15. such a configuration is suitable for suppressing an increase in the number of terminals as well as measuring the junction temperature stably when driving the switching element 1.

Regarding the first terminal 41, the second terminal 42, and the third terminal 43 corresponding to the three terminals, i.e., the gate terminal, the source terminal, and the drain terminal, the first terminal 41 (gate terminal) and the second terminal 42 (source terminal) are at the outermost positions that are opposite to each other in the third direction x. The third terminal 43 (drain terminal) is positioned between the first terminal 41 and the second terminal 42 in the third direction x. According to such a configuration, the arrangement of the first terminal 41, the second terminal 42, and the third terminal 43 (the gate terminal, the source terminal, and the drain terminal) is the same as in a conventional three-terminal switching device (semiconductor device). This makes it easy to handle mounting on a circuit board or the like.

The first distance d13 in the third direction x between the center line C1 of the first terminal 41 and the center line C3 of the third terminal 43 is larger than the second distance d34 in the third direction x between the center line C3 of the third terminal 43 and the center line C4 of the fourth terminal 44, and is larger than the third distance d24 in the third direction x between the center line C4 of the fourth terminal 44 and the center line C2 of the second terminal 42. As a result, the fourth terminal 44 is positioned in the middle among the three terminals 43, 44, and 42 aligned at relatively small intervals. According to such a configuration, the fourth terminal 44, which is exclusively used for electrical connection with the temperature detection diode 15, can be easily distinguished from the other first to third terminals 41 to 43.

Furthermore, the tip side of the fourth terminal 44, which is the portion beyond the bent portion 444, is shifted to one side in the first direction z (the side to which the obverse surface 26a of the obverse-surface conductive layer 26 faces). According to such a configuration, the fourth terminal 44, which is exclusively used for electrical connection with the temperature detection diode 15, can be easily distinguished from the other first to third terminals 41 to 43. Furthermore, the creepage distance between the third terminal 43 (drain terminal) and the second terminal 42 (source terminal) can be appropriately provided by covering, with an insulating resin through a potting process or the like, a part of the fourth terminal 44 that is exposed from the sealing resin 7 and that extends from the bent portion 444 to the sealing resin 7. This makes it possible to increase withstand voltage for the third terminal 43 (drain terminal) and the second terminal 42 (source terminal).

The fourth terminal 44 may be configured without the bent portion 444. In this case, the fourth terminal 44 extends straight along the second direction y, and the position of the fourth terminal 44 in the first direction z (the position in the vertical direction) is substantially aligned with the positions of the first terminal 41, the second terminal 42, and the third terminal 43 in the first direction z.

Figure 12:
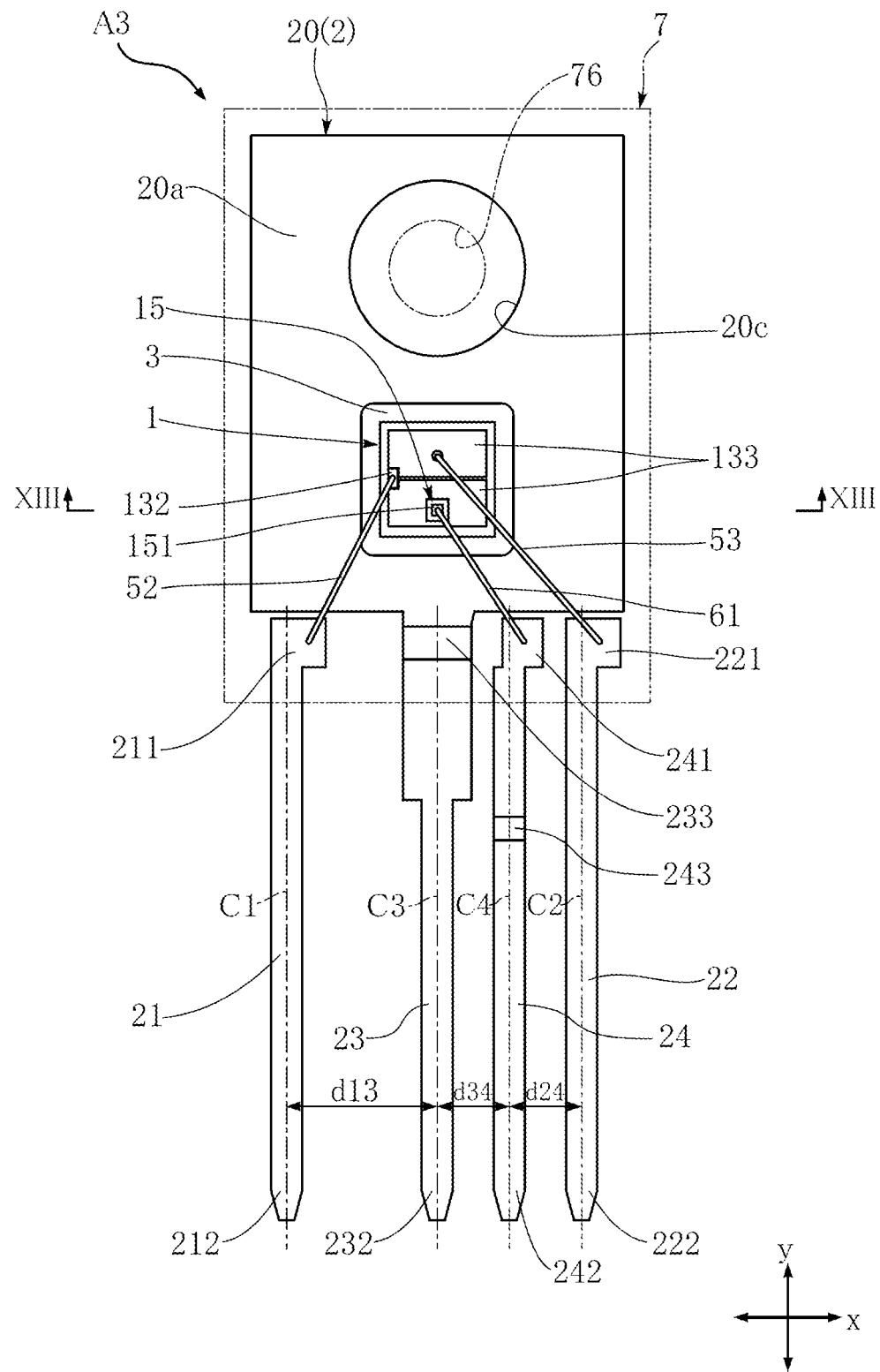
FIG. 12 is a plan view showing a semiconductor device according to a third embodiment.
Figure 13:
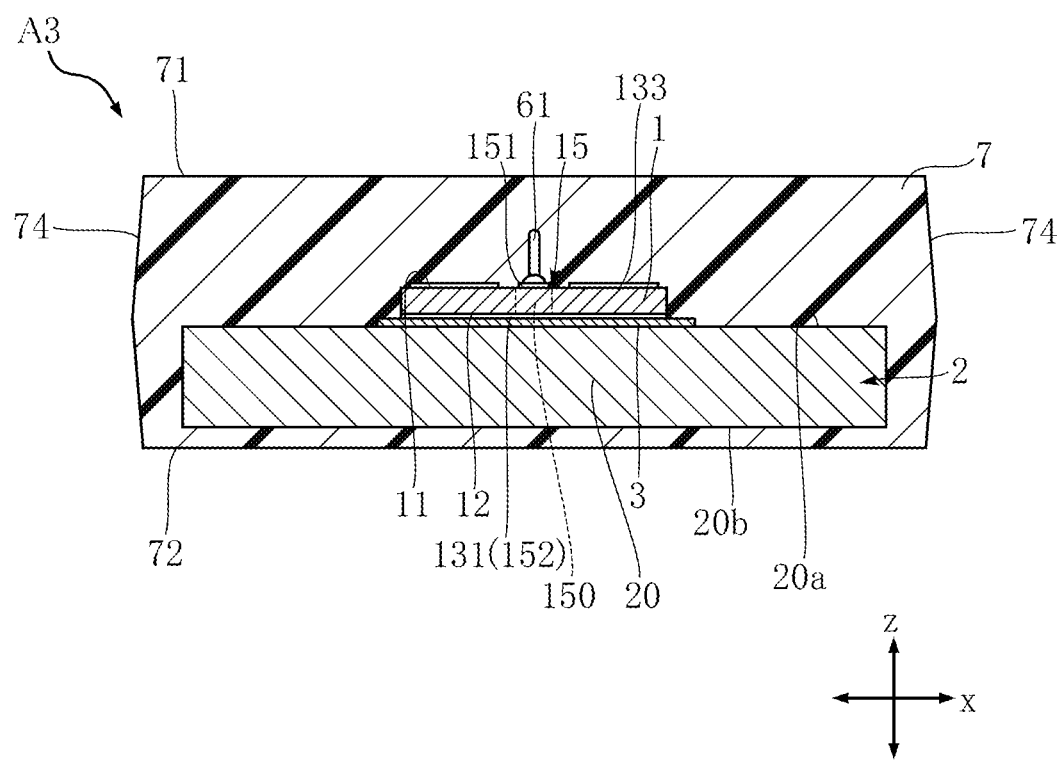
FIG. 13 is a cross-sectional view taken along line XIII-XIII in FIG. 12.

FIGS. 12 and 13 show a semiconductor device according to a third embodiment of the present disclosure. A semiconductor device A3 of the present embodiment is different from the semiconductor device A1 in the configuration of the temperature detection diode 15. In FIG. 12, the sealing resin 7 is shown as transparent, and the sealing resin 7 is indicated by an imaginary line.

In the present embodiment, the first electrode 151 of the temperature detection diode 15 is arranged on the element obverse surface 11, whereas the second electrode 152 is arranged on the element reverse surface 12. The pn junction diode portion 150 is formed to extend through the switching element 1 in the thickness direction (first direction z). In the present embodiment, the drain electrode 131 arranged on the element reverse surface 12 also serves as the second electrode 152. The third terminal 23, which is a drain terminal, is electrically connected to the drain electrode 131 (second electrode 152) via the die pad 20 and the bonding member 3. In the present embodiment, the second wire 62 is not provided.

The semiconductor device A3 according to the present embodiment includes the first terminal 21, the second terminal 22, and the third terminal 23, which correspond to the three terminals, i.e., the gate terminal, the source terminal, and the drain terminal, and also includes the fourth terminal 24. The switching element 1 includes the temperature detection diode 15, and the first electrode 151 of the temperature detection diode 15 is electrically connected to the fourth terminal 24 via the first wire 61. On the other hand, the second electrode 152 of the temperature detection diode 15 is electrically connected to another terminal (the third terminal 23 in the present embodiment). According to such a configuration, the junction temperature of the switching element 1 can be measured by supplying a current to the temperature detection diode 15 with the use of the fourth terminal 24 and the third terminal 23 that are electrically connected to the temperature detection diode 15, measuring the voltage, and using the temperature dependence of the resistance change of the diode. In the present variation, the fourth terminal 24, which is exclusively used for electrical connection with the temperature detection diode 15, is provided, whereby the junction temperature can be measured temperature detection diode 15 while the switching element 1 is driven.

Regarding the first terminal 21, the second terminal 22, and the third terminal 23 corresponding to the three terminals, i.e., the gate terminal, the source terminal, and the drain terminal, the first terminal 21 (gate terminal) and the second terminal 22 (source terminal) are at the outermost positions that are opposite to each other in the third direction x. The third terminal 23 (drain terminal) is positioned between the first terminal 21 and the second terminal 22 in the third direction x. According to such a configuration, the arrangement of the first terminal 21, the second terminal 22, and the third terminal 23 (the gate terminal, the source terminal, and the drain terminal) is the same as in a conventional three-terminal switching device (semiconductor device). This makes it easy to handle mounting on a circuit board or the like.

The first distance d13 in the third direction x between the center line C1 of the first terminal 21 and the center line C3 of the third terminal 23 is larger than the second distance d34 in the third direction x between the center line C3 of the third terminal 23 and the center line C4 of the fourth terminal 24, and is larger than the third distance d24 in the third direction x between the center line C4 of the fourth terminal 24 and the center line C2 of the second terminal 22. As a result, the fourth terminal 24 is positioned in the middle among the three terminals 23, 24, and 22 aligned at relatively small intervals. According to such a configuration, the fourth terminal 24, which is exclusively used for electrical connection with the temperature detection diode 15, can be easily distinguished from the other first to third terminals 21 to 23.

Regarding the fourth terminal 24, the tip side beyond the bent portion 243 is shifted to one side in the first direction z (the side to which the obverse surface 20a of the die pad 20 faces). According to such a configuration, the fourth terminal 24, which is exclusively used for electrical connection with the temperature detection diode 15, can be easily distinguished from the other first to third terminals 21 to 23. Furthermore, the creepage distance between the third terminal 23 (drain terminal) and the second terminal 22 (source terminal) can be appropriately provided by covering, with an insulating resin through a potting process or the like, a part of the fourth terminal 24 that is exposed from the sealing resin 7 and that extends from the bent portion 243 to the sealing resin 7. This makes it possible to increase withstand voltage for the third terminal 23 (drain terminal) and the second terminal 22 (source terminal).

Figure 14:
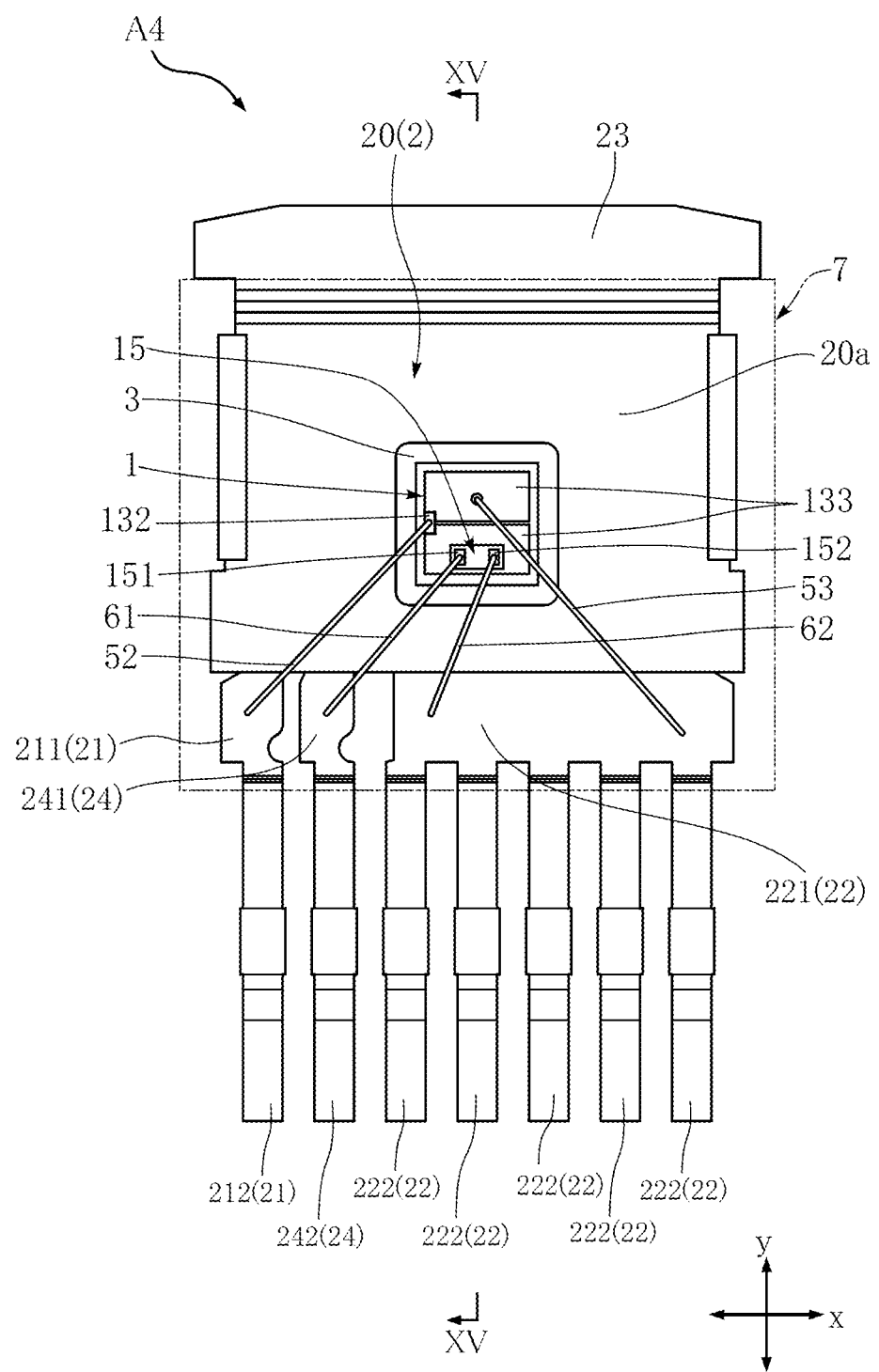
FIG. 14 is a plan view showing a semiconductor device according to a fourth embodiment.
Figure 15:
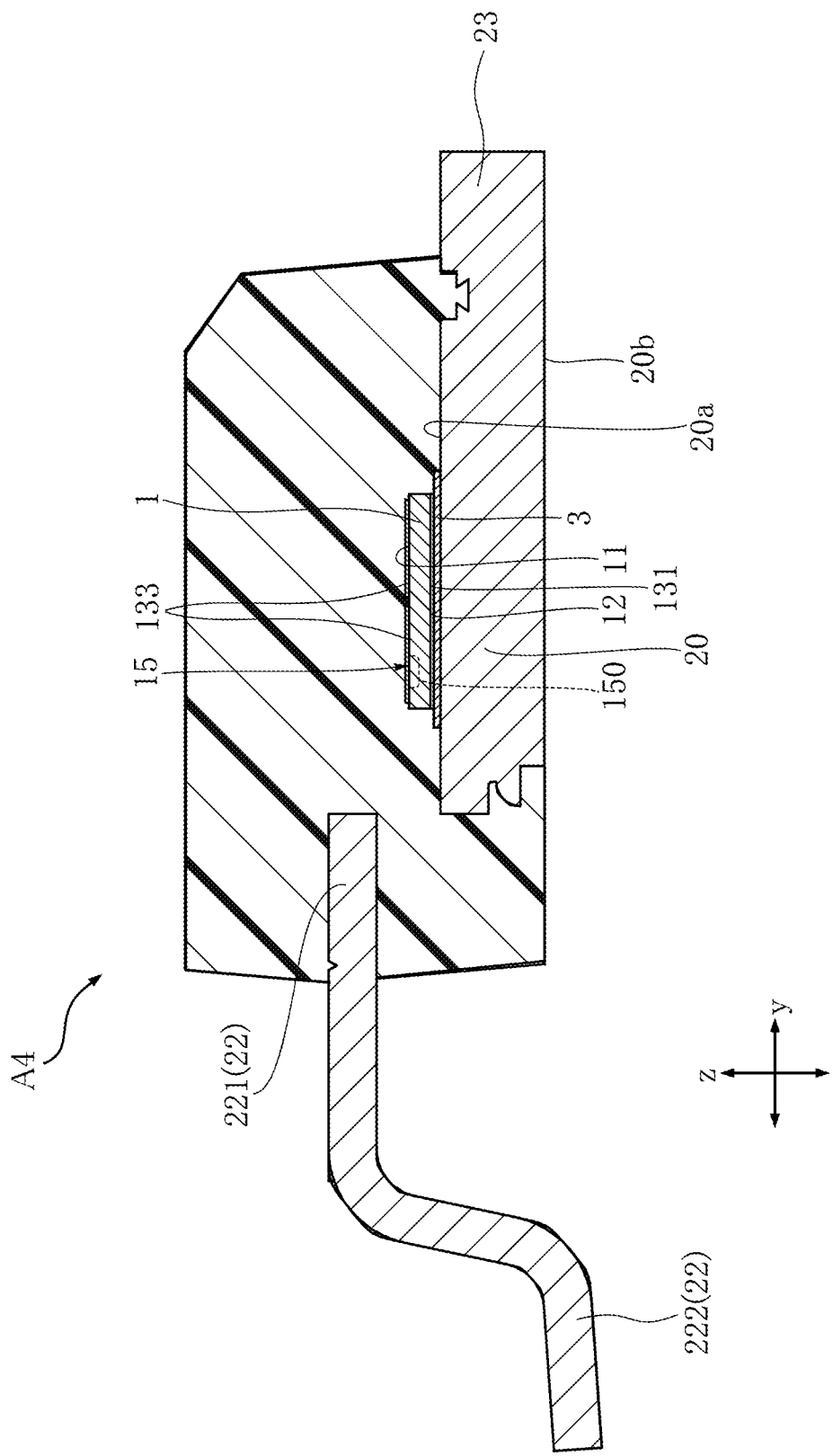
FIG. 15 is a cross-sectional view taken along line XV-XV in FIG. 14.

FIGS. 14 and 15 show a semiconductor device according to a fourth embodiment of the present disclosure. A semiconductor device A4 of the present embodiment is different from the semiconductor device A1 in the specific configurations of the first terminal 21 to the fourth terminal 24, and accordingly, is different from the semiconductor device A1 in the bonding states of the gate wire 52, the source wire 53, the first wire 61, and the second wire 62. In FIG. 14, the sealing resin 7 is shown as transparent, and the sealing resin 7 is indicated by an imaginary line.

In the semiconductor device A4 shown in FIG. 14, the first terminal 21 is spaced apart from the die pad 20, and extends to one side (lower side in the figure) in the second direction y. The first terminal 21 is arranged at the outermost position (left side in the figure) in the third direction x as viewed in the first direction z. The first terminal 21 has a first pad 211 and a tip portion 212. The first terminal 21 is electrically connected to the gate electrode 132 via the gate wire 52. In the present embodiment, the first terminal 21 is the gate terminal of the semiconductor device A4.

The second terminal 22 is spaced apart from the die pad 20, and is arranged on one side (lower side in FIG. 14) in the second direction y. The second terminal 22 has a second pad 221 and a plurality of tip portions 222. The second pad 221 is arranged from the center to the right side in the third direction x as viewed in the first direction z. The plurality of tip portions 222 are arranged at intervals in the third direction x and connected to the second pad 221. The second terminal 22 (second pad 221) is electrically connected to the source electrode 133 via the source wire 53. In the present embodiment, the second terminal 22 is the source terminal of the semiconductor device A4. The second wire 62 is bonded to the second pad 221. The second terminal 22 is electrically connected to the second electrode 152 via the second wire 62.

The third terminal 23 is connected to the die pad 20 and arranged on the other side (upper side in FIG. 14) in the second direction y with respect to the die pad 20. The third terminal 23 is elongated in the third direction x. As shown in FIG. 15, the third terminal 23 is electrically connected to the drain electrode 131 via the die pad 20 and the bonding member 3. In the present embodiment, the third terminal 23 is the drain terminal of the semiconductor device A4.

The fourth terminal 24 is spaced apart from the die pad 20, and extends to one side (lower side in FIG. 14) in the second direction y. The fourth terminal 24 is arranged closer to the left side in the figure in the third direction x as viewed in the first direction z. The fourth terminal 24 has a fourth pad 241 and a tip portion 242. The first wire 61 is bonded to the fourth pad 241 of the fourth terminal 24. The fourth terminal 24 is electrically connected to the first electrode 151 via the first wire 61.

As shown in FIG. 14, the gate wire 52 is bonded to the gate electrode 132 of the switching element 1 and the first pad 211 of the first terminal 21, and electrically connects the gate electrode 132 of the switching element 1 and the first terminal 21 to each other. The source wire 53 is bonded to the source electrode 133 of the switching element 1 and the second pad 221 of the second terminal 22, and electrically connects the source electrode 133 of the switching element 1 and the second terminal 22 to each other. In FIG. 15, the source wire 53 is omitted.

The first wire 61 is bonded to the first electrode 151 of the switching element 1 (temperature detection diode 15) and the fourth pad 241 of the fourth terminal 24, and electrically connects the first electrode 151 of the temperature detection diode 15 and the fourth terminal 24 to each other. The second wire 62 is bonded to the second electrode 152 of the switching element 1 (temperature detection diode 15) and the second pad 221 of the second terminal 22, and electrically connects the second electrode 152 of the temperature detection diode 15 and the second terminal 22 to each other. In FIG. 15, the second wire 62 is omitted.

The semiconductor device A4 includes the first terminal 21, the second terminal 22, and the third terminal 23, which correspond to the three terminals, i.e., the gate terminal, the source terminal, and the drain terminal, and also includes the fourth terminal 24. The switching element 1 includes the temperature detection diode 15, and the first electrode 151 of the temperature detection diode 15 is electrically connected to the fourth terminal 24 via the first wire 61. On the other hand, the second electrode 152 of the temperature detection diode 15 is electrically connected to another terminal (the second terminal 22 in the present embodiment) via the second wire 62. According to such a configuration, the junction temperature of the switching element 1 can be measured by supplying a current to the temperature detection diode 15 with the use of the fourth terminal 24 and the second terminal 22 that are electrically connected to the temperature detection diode 15, measuring the voltage, and using the temperature dependence of the resistance change of the diode. In the present embodiment, the fourth terminal 24, which is exclusively used for electrical connection with the temperature detection diode 15, is provided, whereby the junction temperature can be measured with the temperature detection diode 15 while the switching element 1 is driven.

In the present embodiment, the second electrode 152 of the temperature detection diode 15 is electrically connected to the second terminal 22, which is a source terminal. The source terminal (the second terminal 22) is connected to the ground, which is a reference potential, and the potential is stable at substantially 0 V. The second terminal 22 is also used as the terminal of the temperature detection diode 15, so that the junction temperature can be measured stably even when a current is supplied to the temperature detection diode 15. such a configuration is suitable for suppressing an increase in the number of terminals as well as measuring the junction temperature stably when driving the switching element 1.

Figure 16:
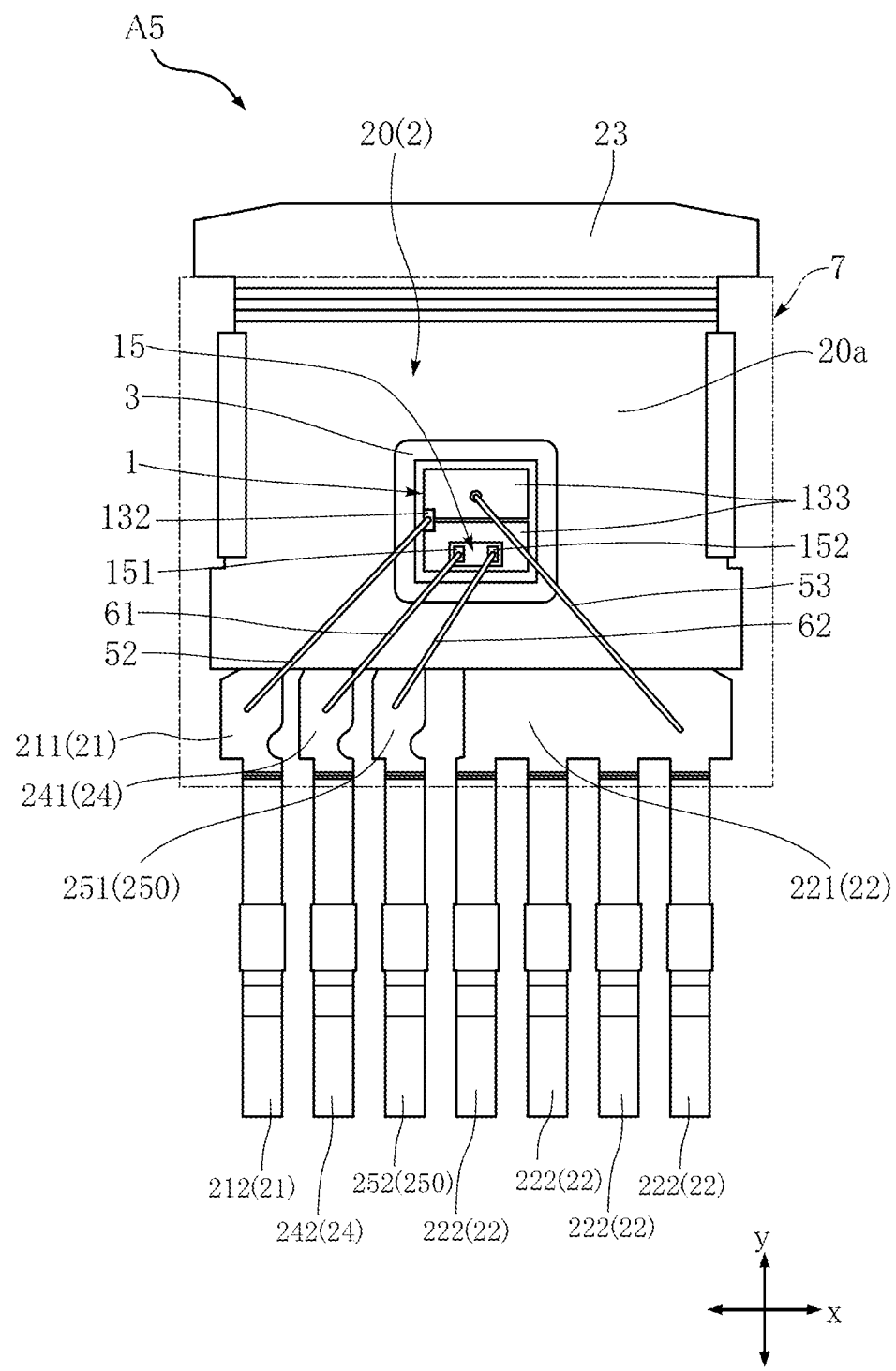
FIG. 16 is a plan view showing a semiconductor device according to a fifth embodiment.

FIG. 16 shows a semiconductor device according to a fifth embodiment of the present disclosure. A semiconductor device A5 of the present embodiment is different from the semiconductor device A4 in additionally including a fifth terminal 250, and accordingly, is different from the semiconductor device A4 in the bonding state of the second wire 62. In FIG. 16, the sealing resin 7 is shown as transparent, and the sealing resin 7 is indicated by an imaginary line.

The fifth terminal 250 is spaced apart from the die pad 20, and extends to one side (lower side in FIG. 16) in the second direction y. The fifth terminal 250 is arranged closer to the center in the figure in the third direction x as viewed in the first direction z. The fifth terminal 250 has a fifth pad 251 and a tip portion 252. The second wire 62 is bonded to the fifth pad 251. The fifth terminal 250 is electrically connected to the second electrode 152 via the second wire 62.

As shown in FIG. 16, the gate wire 52 is bonded to the gate electrode 132 of the switching element 1 and the first pad 211 of the first terminal 21, and electrically connects the gate electrode 132 of the switching element 1 and the first terminal 21 to each other. The source wire 53 is bonded to the source electrode 133 of the switching element 1 and the second pad 221 of the second terminal 22, and electrically connects the source electrode 133 of the switching element 1 and the second terminal 22 to each other.

The first wire 61 is bonded to the first electrode 151 of the switching element 1 (temperature detection diode 15) and the fourth pad 241 of the fourth terminal 24, and electrically connects the first electrode 151 of the temperature detection diode 15 and the fourth terminal 24 to each other. The second wire 62 is bonded to the second electrode 152 of the switching element 1 (temperature detection diode 15) and the fifth pad 251 of the fifth terminal 250, and electrically connects the second electrode 152 of the temperature detection diode 15 and the fifth terminal 250 to each other.

The semiconductor device A5 includes the first terminal 21, the second terminal 22, and the third terminal 23, which correspond to the three terminals, i.e., the gate terminal, the source terminal, and the drain terminal, and also includes the fourth terminal 24 and the fifth terminal 250. The switching element 1 includes the temperature detection diode 15, and the first electrode 151 of the temperature detection diode 15 is electrically connected to the fourth terminal 24 via the first wire 61. On the other hand, the second electrode 152 of the temperature detection diode 15 is electrically connected to the fifth terminal 250 via the second wire 62. According to such a configuration, the junction temperature of the switching element 1 can be measured by supplying a current to the temperature detection diode 15 with the use of the fourth terminal 24 and the fifth terminal 250 that are electrically connected to the temperature detection diode 15, measuring the voltage, and using the temperature dependence of the resistance change of the diode. In the present embodiment, the fourth terminal 24 and the fifth terminal 250, which are exclusively used for electrical connection with the temperature detection diode 15, are provided, whereby the junction temperature can be measured with the temperature detection diode 15 while the switching element 1 is driven.

The semiconductor device according to the present disclosure is not limited to the foregoing embodiments. Various design changes can be made to the specific structures of the elements in the semiconductor device according to the present disclosure.

Figure 17:
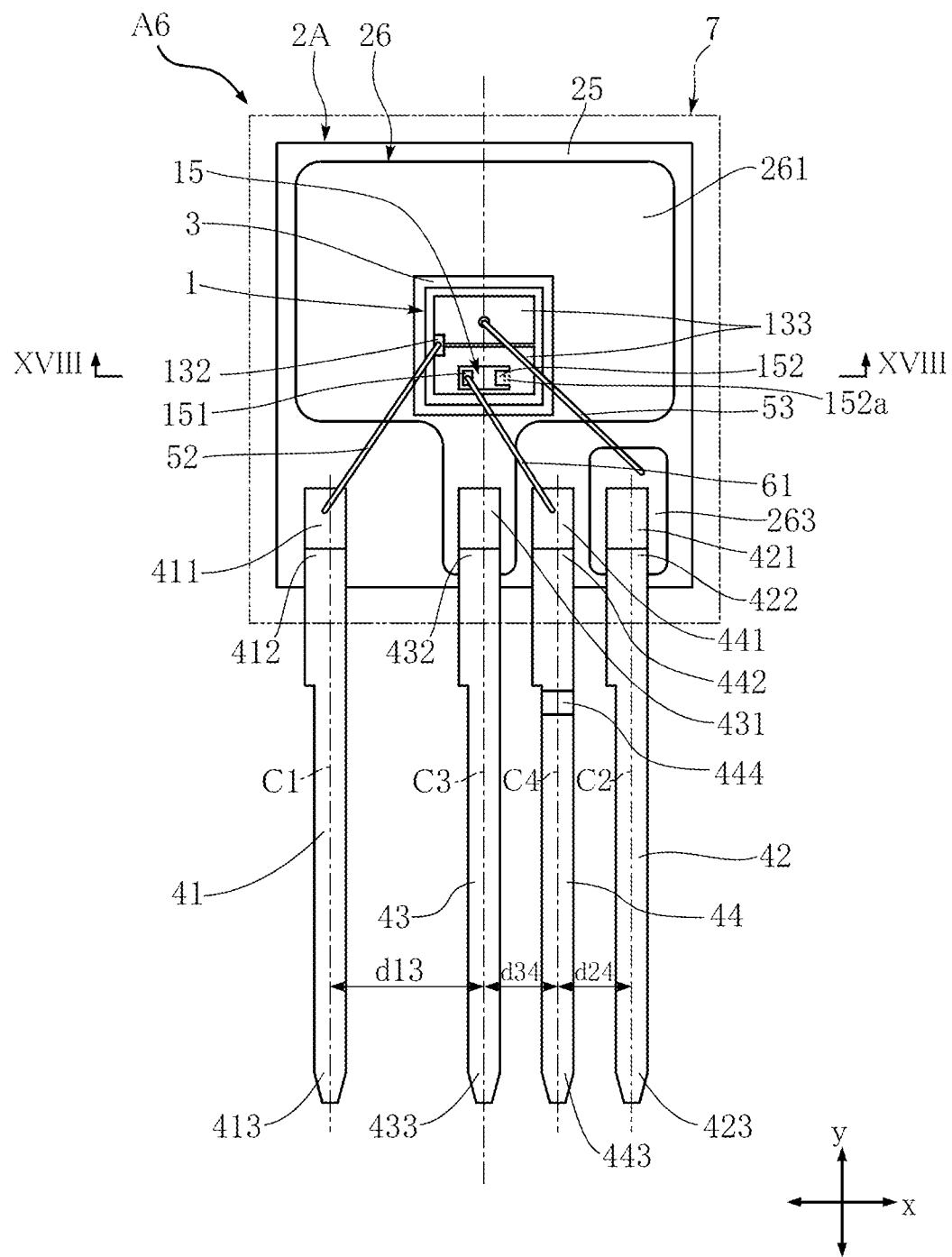
FIG. 17 is a plan view showing a variation of the semiconductor device in FIG. 12.
Figure 18:
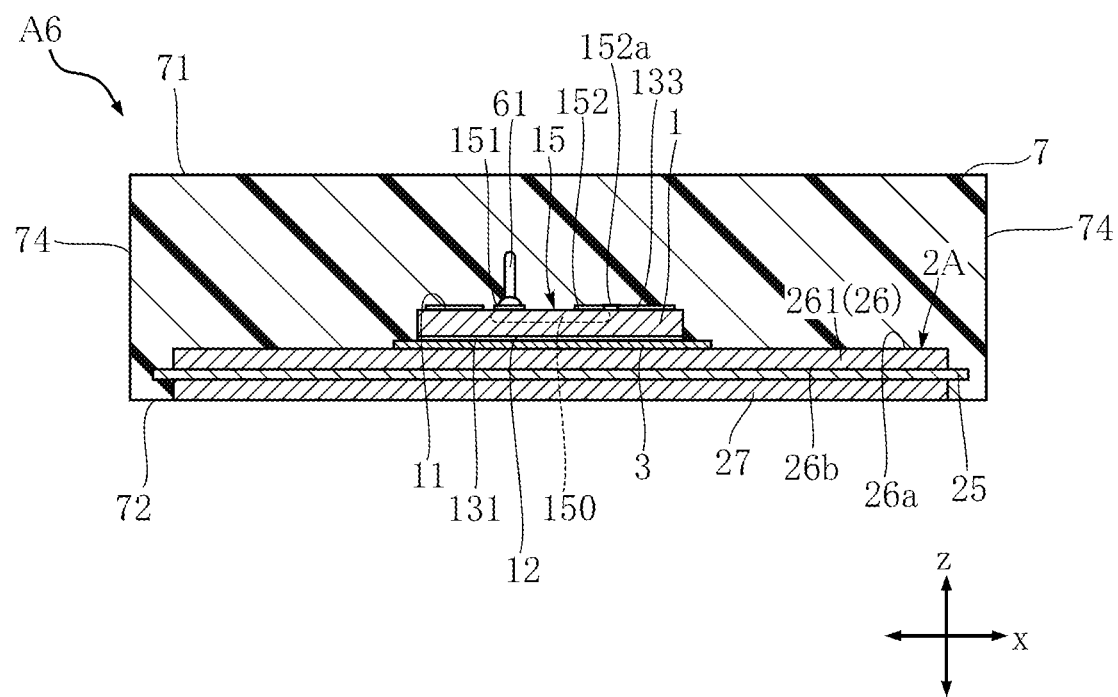
FIG. 18 is a cross-sectional view taken along line XVIII-XVIII in FIG. 17.

For example, FIGS. 17 and 18 show a variation of the semiconductor device according to the third embodiment. In the semiconductor device A3 according to the third embodiment (see FIGS. 12 and 13), the second electrode 152 (e.g., the cathode electrode or the anode electrode) of the temperature sensor (temperature detection diode) 15 is made in common with the drain electrode 131 of the switching element 1. In other words, the second electrode 152 and the drain electrode 131 are directly bonded to each other without the intervention of any individual connecting member such as a wire, or alternatively the second electrode 152 and the drain electrode 131 are integrally formed with each other. In a semiconductor device A6 according to the present variation, one electrode (cathode 152 in the illustrated example) of the temperature sensor 15 is directly connected to the source electrode 133 of the switching element 1 at the upper surface of the switching element 1. In other words, in the semiconductor device A6, the cathode electrode 152 and the source electrode 133 are made in common within one chip.

Specifically, in the semiconductor device A6, a diode 150 at the obverse surface of a SiC substrate (switching element 1) is used as the temperature sensor 15 (see FIG. 18). The temperature sensor 15 includes a cathode, which is made of polysilicon doped with p-type impurities, and an anode, which is made of polysilicon doped with n-type impurities. Although an insulating film is formed between the SiC substrate and the temperature sensor 15, illustration of the insulating film is omitted.

The gate electrode 132 is formed in an active region of the SiC substrate via a gate insulating film. Although the active region includes a source region doped with n-type impurities, and a body region doped with p-type impurities, illustration of these regions is omitted.

An interlayer insulating film is formed on the surface of the SiC substrate, and the source electrode 133, which is made of a metal such as aluminum, is formed on the interlayer insulating film. The gate electrode 132 is electrically separated from the source electrode 133, the source region, and the body region by the interlayer insulating film and the gate insulating film. The source electrode 133 is electrically connected to the source region and the body region of the SiC substrate via an opening in the interlayer insulating film.

The anode electrode 151 and the cathode electrode 152 are formed on the upper portion of the temperature sensor 15. The anode electrode 151 and the cathode electrode 152 are electrically connected to the anode and the cathode of the diode via the opening of the interlayer insulating film, respectively. As described above, in the present variation, the cathode electrode 152 and the source electrode 133 are made in common with each other. In the illustrative example, the cathode electrode 152 and the source electrode 133 are electrically connected to each other via an intermediate conductive connecting part 152a. Note that the cathode electrode 152, the intermediate connecting part 152a, and the source electrode 133 are integrally formed as a whole with the use of the same conductive material. In FIGS. 17 and 18, the dotted lines are used for convenience to indicate the boundaries between these members. Unless otherwise stated, the semiconductor device A6 has the same configuration as the semiconductor device A2 according to the second embodiment, which is shown in FIGS. 9 to 11, for example, except that the two electrodes are made in common. Therefore, description of the same members is omitted here.

According to the configuration shown in FIGS. 17 and 18, the junction temperature of the switching element 1 can be measured by supplying a current to the temperature detection diode 15 with the use of the terminals 42 and 44 that are electrically connected to the temperature sensor, i.e., the temperature detection diode 15, measuring the voltage, and using the temperature dependence of the resistance change of the diode. In the present variation, the terminal 44, which is exclusively used for electrical connection with the temperature detection diode 15, is provided, whereby the junction temperature can be measured with the temperature detection diode 15 while the switching element 1 is driven.

In the above variation, the source electrode 133 and the source terminal 42 are connected to each other via the wire 53. However, a metal plate made of copper (e.g., an elongated metal piece having a rectangular cross section) may be used instead of the wire 53. In this case, the source electrode 133 and the source terminal 42 are bonded to the metal plate via a bonding member such as solder. The connection between the gate electrode 132 and the gate terminal 41 and the connection between the anode electrode 151 and the terminal 44 may be established by the wire 52 and the wire 61 as the illustrated example, or may be established by metal plates instead of the wires 52 and 61. When the source electrode 133 and the source terminal 42 are bonded to each other via the metal plate, it is preferable that a nickel plating layer or a nickel-palladium-gold plating layer be formed on the source electrode 133 (and thus the cathode electrode 152). In this case, the same plating structure as the source electrode 133 is formed on each of the anode electrode 151 and the gate electrode 132.

The present disclosure includes the configurations defined in the following clauses.

Clause 1.
A semiconductor device comprising:
a switching element having an element obverse surface and an element reverse surface that face away from each other in a first direction, and including a drain electrode, a gate electrode, and a source electrode, the switching element performing on/off control between the drain electrode and the source electrode by applying a driving voltage across the gate electrode and the source electrode with a potential difference being present between the drain electrode and the source electrode;
a base having an obverse surface and a reverse surface that face away from each other in the first direction, and supporting the switching element with the element reverse surface facing the obverse surface; and
a first terminal, a second terminal, a third terminal, and a fourth terminal that each extend in a second direction perpendicular to the first direction,
wherein the switching element includes a temperature detection diode having a first electrode provided on the element obverse surface,
each of the drain electrode, the gate electrode, and the source electrode is electrically connected to a corresponding one of the first terminal, the second terminal, and the third terminal, and
the first electrode is electrically connected to the fourth terminal via a first wire.

Clause 2.
The semiconductor device according to clause 1, wherein the first terminal, the second terminal, the third terminal, and the fourth terminal extend to a first side in the second direction, and are spaced apart from each other in a third direction perpendicular to both of the first direction and the second direction, and
the first terminal and the second terminal are positioned at respective outermost positions that are opposite to each other in the third direction, the third terminal is positioned between the first terminal and the second terminal in the third direction, and the fourth terminal is positioned between the second terminal and the third terminal.

Clause 3.
The semiconductor device according to clause 2, wherein the temperature detection diode has a second electrode, and
the second electrode is electrically connected to one of the first terminal, the second terminal, and the third terminal.

Clause 4.
The semiconductor device according to clause 3, wherein a first distance in the third direction between the first terminal and the third terminal is larger than a second distance in the third direction between the third terminal and the fourth terminal, and also than a third distance in the third direction between the fourth terminal and the second terminal.

Clause 5.
The semiconductor device according to clause 4, wherein the gate electrode is electrically connected to the first terminal, the source electrode is electrically connected to the second terminal, and the drain electrode is electrically connected to the third terminal.

Clause 6.
The semiconductor device according to clause 5, wherein the second electrode is electrically connected to the second terminal.

Clause 7.
The semiconductor device according to clause 4, wherein the drain electrode is electrically connected to the first terminal, the gate electrode is electrically connected to the second terminal, and the source electrode is electrically connected to the third terminal.

Clause 8.
The semiconductor device according to clause 7, wherein the second electrode is electrically connected to the third terminal.

Clause 9.
The semiconductor device according to clause 3 or 4, wherein the second electrode is arranged on the element obverse surface, and is electrically connected to one of the first terminal, the second terminal, and the third terminal via a second wire.

Clause 10.
The semiconductor device according to clause 3 or 4, wherein the second electrode is arranged on the element reverse surface.

Clause 11.
The semiconductor device according to any of clauses 2 to 4, wherein the gate electrode and the source electrode are arranged on the element obverse surface, and the drain electrode is arranged on the element reverse surface, and
each of the gate electrode and the source electrode is electrically connected to one of the first terminal, the second terminal, and the third terminal via either a gate wire or a source wire.

Clause 12.

The semiconductor device according to any of clauses 2 to 11, further comprising a lead frame including the base and the third terminal, wherein the third terminal extends along the second direction from the base.

Clause 13.

The semiconductor device according to any of clauses 2 to 11, further comprising a substrate, the substrate including an obverse-surface conductive layer forming the base and an insulating layer on which the obverse-surface conductive layer is formed.

Clause 14.

The semiconductor device according to any of clauses 2 to 13, wherein at least a tip portion of the fourth terminal at the first side in the second direction is shifted to a side to which the obverse surface of the base faces in the first direction, as compared to respective tip portions of the first terminal, the second terminal, and the third terminal in the first side in the first direction.

Clause 15.

The semiconductor device according to clause 1, wherein the first terminal, the second terminal, and the fourth terminal are arranged on a first side in the second direction, and are spaced apart from each other in a third direction perpendicular to both of the first direction and the second direction,
the third terminal is arranged on a second side in the second direction, and
the gate electrode is electrically connected to the first terminal, the source electrode is electrically connected to the second terminal, and the drain electrode is electrically connected to the third terminal.

Clause 16.

The semiconductor device according to clause 15, wherein the temperature detection diode has a second electrode, and
the second electrode is electrically connected to the second terminal.

Clause 17.

The semiconductor device according to clause 15, further comprising a fifth terminal extending to the first side in the second direction,
wherein the temperature detection diode has a second electrode, and
the second electrode is electrically connected to the fifth terminal.

Clause 18.

The semiconductor device according to any of clauses 15 to 17, further comprising a lead frame including the base and the third terminal, wherein the third terminal extends to the second side in the second direction from the base.

Clause 19.

The semiconductor device according to any of clauses 1 to 18, further comprising a sealing resin covering the base, a part of each of the first to fourth terminals, and the switching element.

Clause 20.

The semiconductor device according to any of clauses 1 to 19, wherein the switching element is a SiC switching element.

Clause 21.

A semiconductor device comprising: a switching element; a first external terminal; a second external terminal; a third external terminal; and a fourth external terminal,
wherein the switching element includes:
an element obverse surface and an element reverse surface that face away from each other in a first direction;
a first main electrode (source electrode/emitter electrode) on the element obverse surface;
a gate electrode on the element obverse surface;
a second main electrode (drain electrode/collector electrode) on the element reverse surface;
a temperature detection diode including an anode and a cathode; and
a first electrode that is electrically connected to one of the anode and the cathode and arranged on the element obverse surface,
the first external terminal is electrically connected to the second main electrode,
the second external terminal is electrically connected to the gate electrode,
the third external terminal is electrically connected to the first main electrode,
the fourth external terminal is electrically connected to the first electrode, and
the anode is electrically connected to one of the first external terminal and the fourth external terminal, and the cathode is electrically connected to the other one of the first external terminal and the fourth external terminal.

Clause 22.

The semiconductor device according to clause 21, further comprising a sealing resin that covers the switching element and a part of each of the first external terminal, the second external terminal, the third external terminal, and the fourth external terminal.

Clause 23.

The semiconductor device according to clause 21 or 22, a first conductive member connecting the further comprising: first main electrode and the third external terminal;
a second conductive member connecting the gate electrode and the second external terminal; and
a third conductive member connecting the first electrode and the fourth external terminal.

Clause 24.

The semiconductor device according to clause 23, wherein the first conductive member, the second conductive member, and the third conductive member are either bonding wires or metal plates, the bonding wires are made of either aluminum or copper, and the metal plates are made of copper.

Clause 25.

The semiconductor device according to clause 24, further comprising bonding members for fixing the metal plates to bonding targets.

Clause 26.

The semiconductor device according to clause 25, wherein the bonding members are made of solder.

Clause 27.

The semiconductor device according to any of clauses 21 to 26, configured to perform on/off control between the first main electrode and the second main electrode by applying a driving voltage across the gate electrode and the first main electrode with a potential difference between the first main electrode and the second main electrode.

Clause 28.

The semiconductor device according to any of clauses 21 to 27, further comprising a base facing the element reverse surface and supporting the switching element.

Clause 29.

A semiconductor device comprising: a switching element; a first external terminal; a second external terminal; a third external terminal; and a fourth external terminal, wherein the switching element includes:
an element obverse surface and an element reverse surface that face away from each other in a first direction;
a first main electrode (source electrode/emitter electrode) on the element obverse surface;
a gate electrode on the element obverse surface;
a second main electrode (drain electrode/collector electrode) on the element reverse surface;
a temperature detection diode including an anode and a cathode; and
a first electrode that is electrically connected to one of the anode and the cathode and arranged on the element obverse surface,
the first external terminal is electrically connected to the second main electrode,
the second external terminal is electrically connected to the gate electrode,
the third external terminal is electrically connected to the first main electrode,
the fourth external terminal is electrically connected to the first electrode, and
the anode is electrically connected to one of the third external terminal and the fourth external terminal, and the cathode is electrically connected to the other one of the third external terminal and the fourth external terminal.

Clause 30.

The semiconductor device according to clause 29, further comprising a sealing resin that covers the switching element and a part of each of the first external terminal, the second external terminal, the third external terminal, and the fourth external terminal.

Clause 31.

The semiconductor device according to clause 29 or 30, further comprising:
a first conductive member connecting the first main electrode and the third external terminal;
a second conductive member connecting the gate electrode and the second external terminal; and
a third conductive member connecting the first electrode and the fourth external terminal.

Clause 32.

The semiconductor device according to clause 31, wherein the first conductive member, the second conductive member, and the third conductive member are either bonding wires or metal plates, the bonding wires are made of either aluminum or copper, and the metal plates are made of copper.

Clause 33.

The semiconductor device according to clause 32, further comprising bonding members for fixing the metal plates to bonding targets.

Clause 34.

The semiconductor device according to clause 33, wherein the bonding members are made of solder.

Clause 35.

The semiconductor device according to any of clauses 29 to 34, configured to perform on/off control between the first main electrode and the second main electrode by applying a driving voltage across the gate electrode and the first main electrode with a potential difference between the first main electrode and the second main electrode.

Clause 36.

The semiconductor device according to any of clauses 29 to 35, further comprising a base facing the element reverse surface and supporting the switching element.

REFERENCE SIGNS

A1, A11, A12, A2, A3, A4, A5, A6: Semiconductor device
1: Switching element 11: Element obverse surface
12: Element reverse surface 131: Drain electrode
132: Gate electrode 133: Source electrode
15: Temperature detection diode 150: pn junction diode portion
151: First electrode 152: Second electrode
2: Lead frame 2A: Substrate 20: Die pad (Base)
20a: Obverse surface 20b: Reverse surface 20c: Through hole
21: First terminal 22: Second terminal 23: Third terminal
24: Fourth terminal 250: Fifth terminal 211: First pad
221: Second pad 231: Third pad 241: Fourth pad
251: Fifth pad 212, 222, 232, 242, 252: Tip portion
213: Intermediate bent portion 233: Intermediate bent portion
243: Bent portion 25: Insulating layer
26: Obverse-surface conductive layer 26a: Obverse surface
26b: Reverse surface 261: Drain electrode portion
263: Source electrode portion 27: Reverse-surface metal layer
3: Bonding member 41: First terminal 42: Second terminal
43: Third terminal 44: Fourth terminal
411, 421, 431, 441: Bonding portion
412, 422, 432, 442: Bent portion
413, 423, 433, 443: Tip portion 444: Bent portion
61: First wire 62: Second wire 7: Sealing resin
71: Resin obverse surface 72: Resin reverse surface
73: Resin first side surface 74: Resin second side surface
75: Recess 76: Resin through hole
C1, C2, C3, C4: Center line d13: First distance
d24: Third distance d34: Second distance
x: Third direction y: Second direction z: First direction

The invention claimed is:

1. A semiconductor device comprising:
a switching element having an element obverse surface and an element reverse surface that face away from each other in a first direction, and including a drain electrode, a gate electrode, and a source electrode, the switching element performing on/off control between the drain electrode and the source electrode by applying a driving voltage across the gate electrode and the source electrode with a potential difference being present between the drain electrode and the source electrode;
a base having an obverse surface and a reverse surface that face away from each other in the first direction, and supporting the switching element with the element reverse surface facing the obverse surface; and
a first terminal, a second terminal, a third terminal, and a fourth terminal that each extend in a second direction perpendicular to the first direction,
wherein the switching element includes a temperature detection diode having a first electrode and a second electrode provided on the element obverse surface,
the temperature detection diode includes a pn junction diode portion built into the switching element by a semiconductor process, each of the drain electrode, the gate electrode, and the source electrode is electrically connected to a corresponding one of the first terminal, the second terminal, and the third terminal,
the first electrode is electrically connected to the fourth terminal, but is connected to none of the first terminal, the second terminal, and the third terminal, and
the second electrode is electrically connected to one of the first terminal, the second terminal, and the third terminal.

2. The semiconductor device according to claim 1, wherein the first terminal, the second terminal, the third terminal, and the fourth terminal extend to a first side in the second direction, and are spaced apart from each other in a third direction perpendicular to both of the first direction and the second direction, and
the first terminal and the second terminal are positioned at respective outermost positions that are opposite to each other in the third direction, the third terminal is positioned between the first terminal and the second terminal in the third direction, and the fourth terminal is positioned between the second terminal and the third terminal.

3. The semiconductor device according to claim 1, wherein a first distance in the third direction between the first terminal and the third terminal is larger than a second distance in the third direction between the third terminal and the fourth terminal, and also than a third distance in the third direction between the fourth terminal and the second terminal.

4. The semiconductor device according to claim 3, wherein the gate electrode is electrically connected to the first terminal, the source electrode is electrically connected to the second terminal, and the drain electrode is electrically connected to the third terminal.

5. The semiconductor device according to claim 4, wherein the second electrode is electrically connected to the second terminal.

6. The semiconductor device according to claim 3, wherein the drain electrode is electrically connected to the first terminal, the gate electrode is electrically connected to the second terminal, and the source electrode is electrically connected to the third terminal.

7. The semiconductor device according to claim 6, wherein the second electrode is electrically connected to the third terminal.

8. The semiconductor device according to claim 3, wherein the second electrode is arranged on the element obverse surface, and is electrically connected to one of the first terminal, the second terminal, and the third terminal via a second wire.

9. The semiconductor device according to claim 3, wherein the second electrode is arranged on the element reverse surface.

10. The semiconductor device according to claim 2, wherein the gate electrode and the source electrode are arranged on the element obverse surface, and the drain electrode is arranged on the element reverse surface, and
each of the gate electrode and the source electrode is electrically connected to one of the first terminal, the second terminal, and the third terminal via either a gate wire or a source wire.

11. The semiconductor device according to claim 2, further comprising a lead frame including the base and the third terminal,
wherein the third terminal extends along the second direction from the base.

12. The semiconductor device according to claim 2, further comprising a substrate, the substrate including an obverse-surface conductive layer forming the base and an insulating layer on which the obverse-surface conductive layer is formed.

13. The semiconductor device according to claim 2, wherein at least a tip portion of the fourth terminal at the first side in the second direction is shifted to a side to which the obverse surface of the base faces in the first direction, as compared to respective tip portions of the first terminal, the second terminal, and the third terminal in the first side in the first direction.

14. The semiconductor device according to claim 1, wherein the first terminal, the second terminal, and the fourth terminal are arranged on a first side in the second direction, and are spaced apart from each other in a third direction perpendicular to both of the first direction and the second direction,
the third terminal is arranged on a second side in the second direction, and
the gate electrode is electrically connected to the first terminal, the source electrode is electrically connected to the second terminal, and the drain electrode is electrically connected to the third terminal.

15. The semiconductor device according to claim 14, wherein
the second electrode is electrically connected to the second terminal.

16. The semiconductor device according to claim 14, further comprising a fifth terminal extending to the first side in the second direction,
wherein
the second electrode is electrically connected to the fifth terminal.

17. The semiconductor device according to claim 14, further comprising a lead frame including the base and the third terminal,
wherein the third terminal extends to the second side in the second direction from the base.

18. The semiconductor device according to claim 1, further comprising a sealing resin covering the base, a part of each of the first to fourth terminals, and the switching element.

19. The semiconductor device according to claim 1, wherein the switching element is a SiC switching element.

20. The semiconductor device according to claim 1, wherein
the temperature detection diode includes an anode and a cathode,
the first electrode is electrically connected to one of the anode and the cathode and arranged on the element obverse surface, and
the second electrode is electrically connected to another one of the anode and the cathode.

* * * * *